United States Patent
Wilcoxson et al.

(10) Patent No.: US 6,518,705 B2
(45) Date of Patent: Feb. 11, 2003

(54) METHOD AND APPARATUS FOR PRODUCING UNIFORM PROCESS RATES

(75) Inventors: Mark H. Wilcoxson, Piedmont, CA (US); Andrew D. Bailey, III, Pleasanton, CA (US); Andras Kuthi, Thousand Oaks, CA (US); Michael G. R. Smith, Dublin, CA (US); Alan M. Schoepp, Ben Lomond, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 10/033,807

(22) Filed: Dec. 18, 2001

(65) Prior Publication Data

US 2002/0175869 A1 Nov. 28, 2002

Related U.S. Application Data

(63) Continuation-in-part of application No. 09/977,569, filed on Oct. 12, 2001, and a continuation-in-part of application No. 09/440,418, filed on Nov. 15, 1999, now Pat. No. 6,320,320.
(60) Provisional application No. 60/308,469, filed on Jul. 27, 2001.

(51) Int. Cl.$^7$ ................................................. H01J 7/24
(52) U.S. Cl. ............................ 315/111.51; 315/111.21; 156/345
(58) Field of Search ..................... 315/111.21, 111.41, 315/111.51, 111.81, 111.91; 156/345; 118/723 R, 723 E, 723 I, 723; 427/569

(56) References Cited

U.S. PATENT DOCUMENTS 5,643,394 A * 7/1997 Maydan et al. ............. 156/345
5,900,699 A * 5/1999 Samukawa et al. ...... 315/111.51
6,302,966 B1 10/2001 Bailey, III et al. ............ 118/724
6,320,320 B1 11/2001 Bailey, III et al. ...... 315/111.51
6,322,661 B1 11/2001 Bailey, III et al. ........... 156/345
6,341,574 B1 1/2002 Bailey III, et al. ........ 118/723 I
6,439,154 B2 * 8/2002 Fukuda et al. ........... 118/723 T

OTHER PUBLICATIONS

U.S. patent application No. 09/440,794, entitled "Materials and Gas Chemistries for Processing Systems", filed Nov. 15, 1999, inventors: Bailey et al.
U.S. patent application No. 09/470,236, entitled "Plasma Processing System with Dynamic Gas Distribution Control", filed Nov. 15, 1999, inventors: Bailey et al.
U.S. patent application No. 09/977,569, entitled Method and Apparatus for Producing Uniform Process Rates, filed Oct. 12, 2001, inventors: Bailey et al.

* cited by examiner

Primary Examiner—Don Wong
Assistant Examiner—Jimmy T. Vu
(74) Attorney, Agent, or Firm—Beyer Weaver & Thomas, LLP

(57) ABSTRACT

An antenna arrangement for generating an electric field inside a process chamber is provided. Generally, the antenna arrangement comprises a first loop disposed around an antenna axis. The first loop comprises a first turn with a first turn gap; a second turn with a second turn gap, where the second turn is concentric and coplanar with the first turn and spaced apart from the first turn, and where the antenna axis passes through the center of the first turn and second turn; and a first turn-second turn connector electrically connected between a second end of the first turn and a first end of the second turn comprising a spanning section between and coplanar with the first turn and the second turn and which spans the first turn gap and the second turn gap.

16 Claims, 19 Drawing Sheets

METHOD AND APPARATUS FOR PRODUCING UNIFORM PROCESS RATES

RELATED APPLICATIONS

This application claims priority under 35 USC 119(e) from the Provisional Application No. 60/308,469 entitled "Antenna Design," which was filed on Jul. 27, 2001 and is a continuation-in-part of U.S. Ser. No. 09/440,418 filed Nov. 15, 1999 U.S. Pat. No. 6,320,320 entitled "Method And Apparatus For Producing Uniform Process Rates," by Bailey, III et al. issued Nov. 20, 2001 and U.S. patent application Ser. No. 09/977,569 filed Oct. 12, 2001, said applications and patent are hereby incorporated by reference.

BACKGROUND OF THE INVENTION

The present invention relates to apparatus and methods for processing substrates such as semiconductor substrates for use in IC fabrication or glass panels for use in flat panel display applications. More particularly, the present invention relates to improved plasma processing systems that are capable of processing substrates with a high degree of processing uniformity across the substrate surface.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels.

During processing, multiple deposition and/or etching steps are typically employed. During deposition, materials are deposited onto a substrate surface (such as the surface of a glass panel or a wafer). For example, deposited layers such as various forms of silicon, silicon dioxide, silicon nitride, metals and the like may be formed on the surface of the substrate. Conversely, etching may be employed to selectively remove materials from predefined areas on the substrate surface. For example, etched features such as vias, contacts, or trenches may be formed in the layers of the substrate.

One particular method of plasma processing uses an inductive source to generate the plasma. FIG. 1 illustrates a prior art inductive plasma processing reactor 100 that is used for plasma processing. A typical inductive plasma processing reactor includes a chamber 102 with an antenna or inductive coil 104 disposed above a dielectric window 106. Typically, antenna 104 is operatively coupled to a first RF power source 108. Furthermore, a gas port 110 is provided within chamber 102 that is arranged for releasing gaseous source materials, e.g., the etchant source gases, into the RF-induced plasma region between dielectric window 106 and a substrate 112. Substrate 112 is introduced into chamber 102 and disposed on a chuck 114, which generally acts as an electrode and is operatively coupled to a second RF power source 116.

In order to create a plasma, a process gas is input into chamber 102 through gas port 110. Power is then supplied to inductive coil 104 using first RF power source 108. The supplied RF energy couples through the dielectric window 106 and a large electric field is induced inside chamber 102. More specifically, in response to the electric field, a circulating current is induced in chamber 102. The electric field accelerates the small number of electrons present inside the chamber causing them to collide with the gas molecules of the process gas. These collisions result in ionization and initiation of a discharge or plasma 118. As is well known in the art, the neutral gas molecules of the process gas when subjected to these strong electric fields lose electrons, and leave behind positively charged ions. As a result, positively charged ions, negatively charged electrons and neutral gas molecules (and/or atoms) are contained inside the plasma 118. As soon as the creation rate of free electrons exceeds their loss rate, the plasma ignites.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 112. Correspondingly, when bottom electrode 114 is powered, ions tend to accelerate towards the substrate where they, in combination with neutral species, activate the etching reaction.

One problem that has been encountered with inductive plasma systems, such as the one mentioned above, has been variations in the etch performance across the substrate, e.g., a non-uniform etch rate. That is, one area of the substrate gets etched differently than another area. As a result, it is extremely difficult to control the parameters associated with the integrated circuit, i.e., critical dimensions, aspect ratios, and the like. Additionally, a non-uniform etch rate may lead to device failure in the semiconductor circuit, which typically translates into higher costs for the manufacturer. Moreover, there also exist other issues of concern such as the overall etch rate, etch profile, micro-loading, selectivity, and the like.

In recent years, it has been found that these non-uniform etch rates may be the result of variations in the plasma density across the surface of the substrate, i.e., a plasma that has regions with greater or lesser amounts of reactive species (e.g., positively charged ions). While not wishing to be bound by theory, it is believed that the variations in plasma density are created by asymmetries that are found in the power transmission characteristics of the power coupling, e.g., antenna, the dielectric window, and/or plasma. If the power coupling is asymmetric, it stands to reason that the circulating current of the induced electric field will be asymmetric, and therefore the ionization and initiation of the plasma will be asymmetric. As a result, variations in the plasma density will be encountered. For example, some antenna arrangements induce a current that is strong in the center of the coil, and weak at the outer diameter of the coil. Correspondingly, the plasma tends to congregate towards the center of the process chamber (as shown in FIG. 1 by plasma 118).

The standard technique for overcoming an asymmetric power coupling has been to compensate or balance out the asymmetries. For example, using a pair of planar antennas to increase the current density at weak current areas, joining radial members to a spiral antenna to form more circular loops at different radii, varying the thickness of the dielectric window to decrease the current density at strong current areas. However, these balancing techniques tend not to provide an azimuthally symmetric power coupling. That is, they still tend to have azithmuthal variations that lead to variations in the plasma, which makes it difficult to obtain etch uniformity.

Moreover, most antenna arrangements used today form some type of capacitive coupling between the antenna and the plasma. Capacitive coupling is created by a voltage drop between the antenna and the plasma. The voltage drop typically forms a sheath voltage at or near the coupling window. For the most part, the sheath voltage tends to act like the bottom electrode (powered). That is, the ions in the plasma tend to be accelerated across the sheath, and therefore accelerate towards the negatively charged coupling window . As a result, the accelerating ions tend to bombard the surface of the coupling window.

These bombarding ions will have substantially the same effect on the coupling window as they do on the substrate, i.e., they will either etch or deposit material on the coupling window surface. This may produce undesirable and/or unpredictable results. For example, deposited material may accumulate on the coupling window and become the source of harmful particulate, especially when material flakes off onto the substrate surface. Removing material from the coupling window will have a similar effect. Eventually, the increase or decrease in thickness will cause process variation, for example, in the power transmission properties of the power coupling (e.g., antenna, dielectric window, plasma). As mentioned, process variation may lead to non-uniform processing, which lead to device failure in the semiconductor circuit.

In view of the foregoing, there are desired improved methods and apparatuses for producing uniform processing at the surface of the substrate. There are also desired improved methods and apparatuses for reducing the capacitive coupling between the antenna and the plasma.

SUMMARY OF THE INVENTION

The invention relates, in one embodiment to an antenna arrangement for generating an electric field inside a process chamber. Generally, the antenna arrangement comprises a first loop disposed around an antenna axis. The first loop comprises a first turn with a first turn gap where a first end of the first turn is on a first side of the first turn gap and a second end of the first turn is on a second side of the first turn gap; a second turn with a second turn gap where a first end of the second turn is on a first side of the second turn gap and a second end of the second turn is on a second side of the second turn gap and where the second turn is concentric and coplanar with the first turn and spaced apart from the first turn, and where the antenna axis passes through the center of the first turn and second turn; and a first turn-second turn connector electrically connected to the first turn and the second turn comprising a spanning section between and coplanar with the first turn and the second turn and which spans the first turn gap and the second turn gap.

The invention relates, in another embodiment to a plasma processing apparatus for processing a substrate. Generally, a process chamber is provided in which a plasma is both ignited and sustained for the processing. A multi-layered antenna is configured to produce an electric field via RF energy inside said process chamber, where the antenna has a first loop and a second loop, which are substantially similar to one another, and which are symmetrically aligned relative to an antenna axis. The first loop comprises a first turn with a first turn gap where a first end of the first turn is on a first side of the first turn gap and a second end of the first turn is on a second side of the first turn gap; a second turn with a second turn gap where a first end of the second turn is on a first side of the second turn gap and a second end of the second turn is on a second side of the second turn gap, where the second turn is concentric and coplanar with the first turn spaced apart from the first turn, and where the antenna axis passes through the center of the first turn and second turn. A first turn-second turn connector is electrically connected between the second end of the first turn and the first end of the second turn. The first turn-second turn connector comprises a spanning section between and coplanar with the first turn and the second turn and which spans the first turn gap and the second turn gap. A multi-layered window is configured to allow the passage of said RF energy from the antenna to the process chamber, the window having a first layer and a second layer, the second layer being arranged to suppress capacitive coupling, which may occur between the plasma and the antenna.

The invention relates, in another embodiment to an antenna arrangement for generating an electric field inside a process chamber. Generally, the antenna arrangement comprises a first turn with a first turn gap where a first end of the first turn is on a first side of the first turn gap and a second end of the first turn is on a second side of the first turn gap and where the first turn gap forms a radial angle of less than 5°; a second turn with a second turn gap wherein a first end of the second turn is on a first side of the second turn gap and a second end of the second turn is on a second side of the second turn gap, wherein the second turn is coaxial with the first turn and spaced apart from the first turn, and where the antenna axis passes through the center of the first turn and second turn where the second turn gap forms a radial angle of less than 5° and where the first turn gap has a length and overlaps with the second turn gap by between 50% and −50% of the first turn gap, and a first current path connector electrically connected to the first turn and the second turn comprising a spanning section which spans the first turn gap and the second turn gap.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

Figure 1:
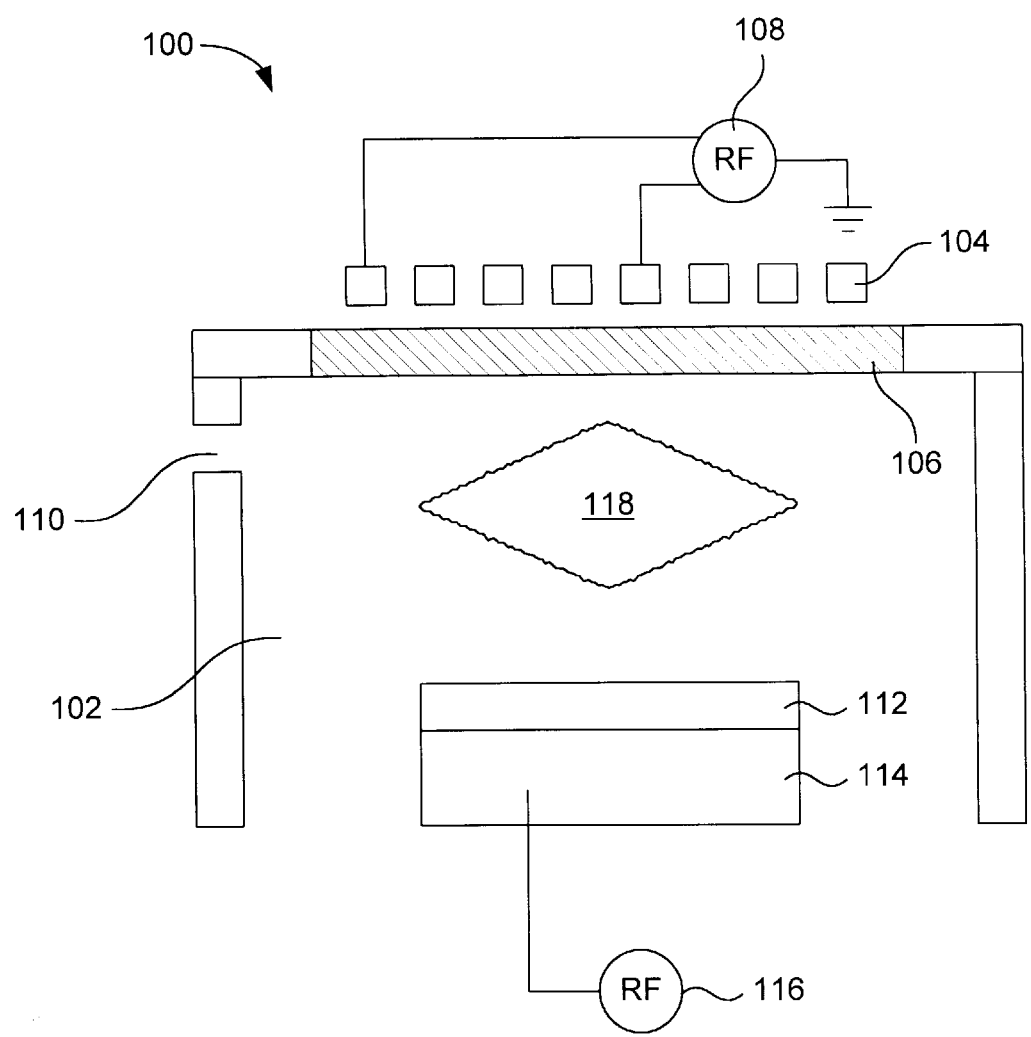
FIG. 1 illustrates a prior art inductive plasma processing reactor that is used for plasma processing.

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In processing substrates, one of the most important parameters that process engineers strive to improve is process uniformity. As the term is employed herein, etch uniformity refers to the uniformity of the entire etch process across the substrate surface including etch rate, microloading, mask selectivity, underlayer selectivity, critical dimension control, and profile characteristics like sidewall angle and roughness. If the etch is highly uniform, for example, it is expected that the etch rates at different points on the substrate tend to be substantially equal. In this case, it is less likely that one area of the substrate will be unduly over-etched while other areas remain inadequately etched.

The present invention provides a plasma processing system for processing substrates that is capable of producing a uniform etch. The plasma processing system includes an RF power source and a process chamber. The plasma processing system further includes a substantially circular antenna operatively coupled to the RF power source and disposed above a plane defined by a substrate when the substrate is disposed within the process chamber for processing. The substantially circular antenna is configured to induce an electric field inside the process chamber with RF energy generated by the RF power source. The substantially circular antenna has at least a first pair of concentric loops in a first plane and a second pair of concentric loops in a second plane. The first pair of concentric loops and the second pair of concentric loops are substantially identical and symmetrically aligned with one another along a common axis.

The plasma processing system further includes a coupling window disposed between the antenna and the process chamber. The coupling window is configured to allow the passage of RF energy from the antenna to the interior of the process chamber. Further, the coupling window has a first layer and a second layer. The second layer is configured to reduce the voltage drop formed between the window and the plasma by absorbing at least a portion of the voltage that passes through the coupling window. The substantially circular antenna and said coupling window are arranged to work together to form an azimuthally symmetric plasma inside the process chamber that produces a substantially uniform process rate across the surface of the substrate.

In accordance with one aspect of the present invention, process uniformity across the substrate surface is achieved by providing an improved antenna arrangement configured for producing a uniform plasma. As mentioned, power is supplied to an antenna to induce an electric field and, consequently, a circulating electric current inside a process chamber. Correspondingly, the electric field accelerates the electrons in the process chamber causing them to collide with the gas molecules of the process gas, which as a result ionizes and initiates the plasma.

Following the creation of the plasma, power is supplied to a lower electrode and the ions are accelerated towards the substrate. The accelerated ions and neutral reactants at the surface of the substrate react with the materials disposed on the substrate surface and therefore process the substrate. In general, when the density of the plasma is greater at one area of the substrate, a non-uniform process rate will be produced. Accordingly, the improved antenna arrangement is configured to reduce these plasma variations by inducing an azimuthally symmetric electric field, and therefore produce a more uniform process rate.

In one embodiment, the improved antenna is configured to produce a circulating current that is azimuthally symmetric. While not wishing to be bound by theory, it is believed that transmission line characteristics of the power coupling create azimuthal variations in the circulating current in response to the induced electric field. These transmission line characteristics tend to produce standing waves that form fluctuating areas of high and low voltage along the length of the antenna, which as a result form fluctuating areas of high and low current densities in the induced electric field, i.e., when the voltage is high, the current is low and when the voltage is low, the current is high. As is well known to those skilled in the art, power deposition into the plasma depends on the current density. For example, where the current density is high the plasma density tends to be high and where the current density is low the plasma density tends to be low. Accordingly, an azimuthally asymmetric plasma is typically produced when the current density has fluctuating areas of high and low current.

To be more specific, when the wavelength of the RF energy is smaller than the length of the antenna more nodes will appear in the standing wave pattern. Generally, standing waves are governed by the equation, antenna electrical length=½ (wavelength)*n, where n=the number of nodes. Most antenna arrangements are about 1½ to about 2½ wavelengths in length, and as a result produce about 3 to 5 nodes. These nodes correspond to the low voltages mentioned above.

The improved antenna overcomes this disadvantage by being configured to behave as a lumped circuit element in the power delivery system rather than a transmission line. That is, the improved antenna is configured to have an apparent length that is smaller than the wavelength of the RF energy at the operating frequency. As a result, the amount of nodes is reduced and therefore, the azimuthal variations of the induced current are substantially eliminated and the transmission line analogy no longer holds.

In one embodiment, the improved antenna arrangement is a multi-turn antenna that acts like a single turn antenna. The multi-turn antenna is a substantially single conductive element that includes a plurality of loops, which are closely wound and stacked together. By closely winding and stacking the loops together, the overall size (e.g., outer diameter) of the antenna may be made smaller without impacting the strength of the induced circulating current. Further, by decreasing the size of the antenna the overall length of the antenna can be made smaller, which as a result reduces the transmission line characteristics of the antenna. Further still, because the loops are disposed proximate to each other, the radial variation typically found between turns may also be reduced. Correspondingly, the improved antenna arrangement advantageously induces a circulating current that is azimuthally symmetric. Accordingly, the azimuthally symmetric circulating current tends to form an azimuthally symmetric plasma, which as a result, tends to produce uniform plasma processing at the surface of the substrate.

Another aspect of the multi-turn stacked antenna arrangement is the self-shielding characteristics, i.e. the plasma is shielded from the antenna terminal voltage by the turns adjacent to the window. This leads to a significant reduction in capacitive coupling and subsequent window erosion, both of which, will be discussed in greater detail below.

In accordance with another aspect of the present invention, an improved coupling window is configured to reduce the capacitive coupling that occurs between the antenna and the plasma. Most power coupling arrangements (e.g., antenna, coupling window, and plasma) create some capacative coupling between the antenna and the plasma. Capacitive coupling is created by a voltage drop that occurs between the antenna and the plasma. This voltage drop typically creates a sheath voltage proximate to the coupling window. As is well known to those skilled in the art, the sheath voltage may lead to additional variations in the plasma, for example, the sheath voltage may push the plasma away from the window causing a reduction in the inductive coupling coefficient. Additionally, the sheath voltage may even produce significant particle contamination due to the bombardment of the ions against the coupling window. Moreover, any power used up by ion bombardment of the window is typically unavailable for plasma generation, which correspondingly causes a lower plasma density for a given power.

In order to reduce the capacitive coupling between the antenna and the plasma, the improved coupling window is configured to include a dielectric layer and a shielding layer that are disposed together. The shielding layer, which is the layer disposed inside the process chamber, is preferably configured to act as a electrostatic shield that directs the voltage away from the surface of the coupling window. The shielding layer essentially suppresses the capacitive coupling to the plasma. Furthermore, the shielding layer is configured to eliminate the capacitive (electrostatic, gradient of a potential) electric field, while leaving the inductive (curl B, grad F=0 type) electric field substantially unchanged. That is, the coupling window is configured to block direct capacitive coupling through the coupling window, while allowing the antenna to inductively form the plasma (without substantial losses to the shielding layer).

More specifically, the shielding layer is electrically isolated and formed from a conducting or semi-conducting material. Therefore, the voltage drop that would normally occur between the antenna and the plasma now occurs between the antenna and the shielding layer. Accordingly, the sheath voltage near the surface of the coupling window is substantially reduced, which as a result increases the inductive coupling coefficient and reduces the power loss due to the unproductive ion bombardment of the coupling window.

Furthermore, an ungrounded electrostatic shield will produce a uniform electrostatic field, shielding only the variations of the electrostatic fields over the area of the shield. This last feature may be used to facilitate striking of the plasma. Additionally, because the shielding layer is exposed to the interior of the process chamber, it is preferably formed from a material that can resist the thermal, chemical and physical effects of plasma processing.

The features and advantages of the present invention may be better understood with reference to the figures and discussions that follow.

Figure 2:
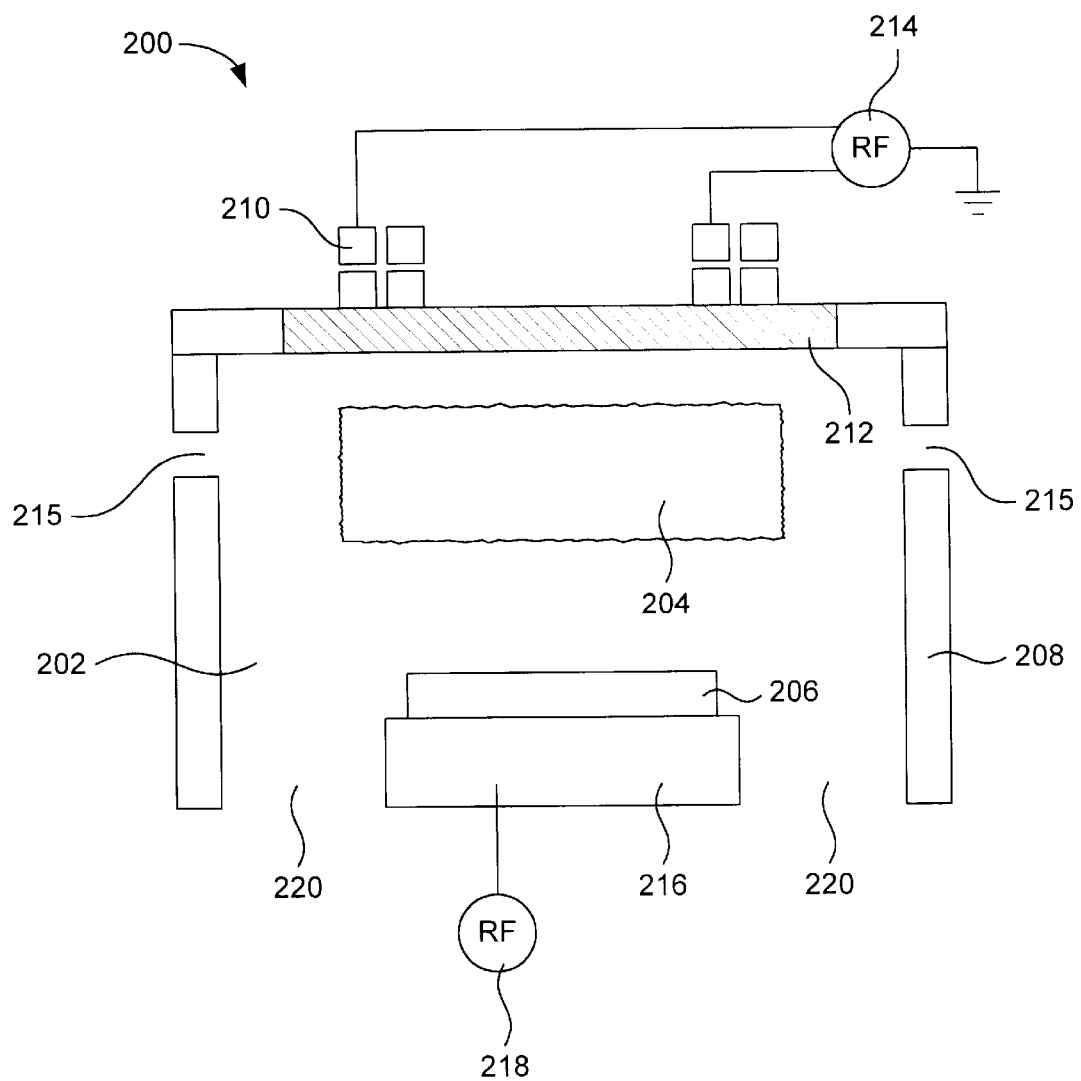
FIG. 2 illustrates a plasma processing system, including an antenna arrangement and a coupling window arrangement, in accordance with one embodiment of the present invention.

FIG. 2 illustrates, in accordance with one embodiment of the present invention, a plasma processing system 200, including a process chamber 202 within which a plasma 204 is both ignited and sustained for processing a substrate 206. Substrate 206 represents the work-piece to be processed, which may represent, for example, a semiconductor substrate to be etched, deposited, or otherwise processed or a glass panel to be processed into a flat panel display. Additionally, process chamber 202 is preferably arranged to be substantially cylindrical in shape, and have substantially vertical chamber walls 208. However, it should be noted that the present invention is not limited to the above and that various configurations of the process chamber may be used.

Plasma processing system 200 further includes an antenna arrangement 210 and a coupling window arrangement 212, which are configured to couple power to plasma 204. Antenna arrangement 210 is coupled to a first RF power supply 214 that is configured to supply antenna arrangement 210 with RF energy having a frequency in the range of about 0.4 MHz to about 50 MHz. Coupling window 212 is configured to allow the passage of the first RF energy from antenna arrangement 210 to the interior of said process chamber. Preferably, coupling window 212 is disposed between substrate 206 and antenna arrangement 210.

Further, antenna arrangement 210 should be sufficiently close to the coupling window to facilitate the formation of plasma 204. That is, the closer the antenna arrangement is to the coupling window, the greater the intensity of the current produced within the chamber. Further still, antenna arrangement 210 is preferably arranged to be co-axial with both process chamber 202, and substrate 206. It should be understood that a symmetric placement of the antenna arrangement may enhance the plasma uniformity across the substrate surface, however, it may not be required for all processes. Antenna arrangement 210 and coupling window 212 will be described in more detail below.

A gas injector 215 is typically provided within chamber 202. Gas injector 215 is preferably disposed around the inner periphery of chamber 202 and is arranged for releasing gaseous source materials, e.g., the etchant source gases, into the RF-induced plasma region between coupling window 212 and substrate 206. Alternatively, the gaseous source materials may also be released from ports built into the walls of the chamber itself or through a showerhead arranged in the dielectric window. It should be understood that a symmetric distribution of gas may enhance the plasma uniformity across the substrate surface, although, it may not be required for all processes. An example of a gas distribution system that may be used in the examplary plasma processing system is described in greater detail in a co-pending patent application entitled, "PLASMA PROCESSING SYSTEM WITH DYNAMIC GAS DISTRIBUTION CONTROL"; U.S. patent application Ser. No. 09/470,236, filed on Nov. 15, 1999 and incorporated herein by reference.

For the most part, substrate 206 is introduced into chamber 202 and disposed on a chuck 216, which is configured to hold the substrate during processing. Chuck 216 may represent, for example, an ESC (electrostatic) chuck, which secures substrate 206 to the chuck's surface by electrostatic force. Typically, chuck 216 acts as a bottom electrode and is preferably biased by a second RF power source 218. Additionally, chuck 216 is preferably arranged to be substantially cylindrical in shape and axially aligned with process chamber 202 such that the process chamber and the chuck are cylindrically symmetric. Chuck 216 may also be configured to move between a first position (not shown) for loading and unloading substrate 206 and a second position (not shown) for processing the substrate.

Still referring FIG. 2, an exhaust port 220 is disposed between chamber walls 202 and chuck 216. However, the actual placement of the exhaust port may vary according to the specific design of each plasma processing system. In cases where a high degree of uniformity is critical, however, a cylindrically symmetric exhaust port can be quite beneficial. Preferably, exhaust port 220 is configured for exhausting by-product gases formed during processing. Further, exhaust port 220 is coupled to a turbomolecular pump (not shown), typically located outside of chamber 202. As is well known to those skilled in the art, the turbomolecular pump maintains the appropriate pressure inside chamber 202.

Furthermore, in the case of semiconductor processing, such as etch processes, a number of parameters within the processing chamber need to be tightly controlled to maintain high tolerance results. The temperature of the processing chamber is one such parameter. Since the etch tolerance (and resulting semiconductor-based device performance) can be highly sensitive to temperature fluctuations of components in the system, accurate control therefore is required. By way of example, a temperature management system that may be used in the examplary plasma processing system for achieving temperature control is described in greater detail in a co-pending patent application entitled, "TEMPERATURE CONTROL SYSTEM FOR PLASMA PROCESSING APPARATUS"; U.S. Pat. No. 6,302,966, issued on Oct. 16, 2001 and incorporated herein by reference.

Additionally, another important consideration in achieving tight control over the plasma process is the material utilized for the plasma processing chamber, e.g., the interior surfaces such as the chamber wall. Yet another important consideration are the gas chemistries used to process the substrates. By way of example, both materials and gas chemistries that may be used in the examplary plasma processing system are described in greater detail in a co-pending patent application entitled, "MATERIALS AND GAS CHEMISTRIES FOR PLASMA PROCESSING SYSTEMS", U.S. patent application Ser. No. 09/440,794, filed on Nov. 15, 1999 and incorporated herein by reference.

In order to create a plasma, a process gas is input into chamber 202 through gas injector 215. Power is then supplied to antenna arrangement 210 using first RF power source 214, and a large electric field is induced inside chamber 202 through coupling window 212. The electric field accelerates the small number of electrons present inside the chamber causing them to collide with the gas molecules of the process gas. These collisions result in ionization and initiation of a discharge or plasma 204. As is well known to those skilled in the art, the neutral gas molecules of the process gas when subjected to these strong electric fields lose electrons, and leave behind positively charged ions. As a result, positively charged ions, negatively charged electrons and neutral gas molecules are contained inside plasma 204.

Once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 206. Correspondingly, when bottom electrode 216 is powered, ions tend to accelerate towards the substrate where they, in combination with neutral species, activate substrate processing, i.e., etching, deposition and/or the like.

For the most part, plasma 204 predominantly stays in the upper region of the chamber (e.g., active region), however, portions of the plasma may tend to fill the entire chamber. The plasma generally goes where it can be sustained, which is almost everywhere in the chamber. By way of example, the plasma may fill the areas below the substrate such as the bellows of the pumping arrangement (e.g., non-active region). If the plasma reaches these areas, etch, deposition and/or corrosion of the areas may ensue, which may lead to particle contamination inside the process chamber, i.e., by etching the area or flaking of deposited material.

Furthermore, an unconfined plasma tends to form a non uniform plasma, which may lead to variations in the process performance, i.e. etch uniformity, overall etch rate, etch profile, micro-loading, selectivity, and the like. In order to reduce the aforementioned effects, a plasma confinement arrangement may be used to confine the plasma. By way of example, a plasma confinement arrangement that may be used in the examplary plasma processing system for confining a plasma is described in greater detail in a co-pending patent application entitled, "METHOD AND APPARATUS FOR CONTROLLING THE VOLUME OF PLASMA", U.S. patent application Ser. No. 09/439,759, filed Nov. 15, 1999 and incorporated herein by reference.

Figure 3:
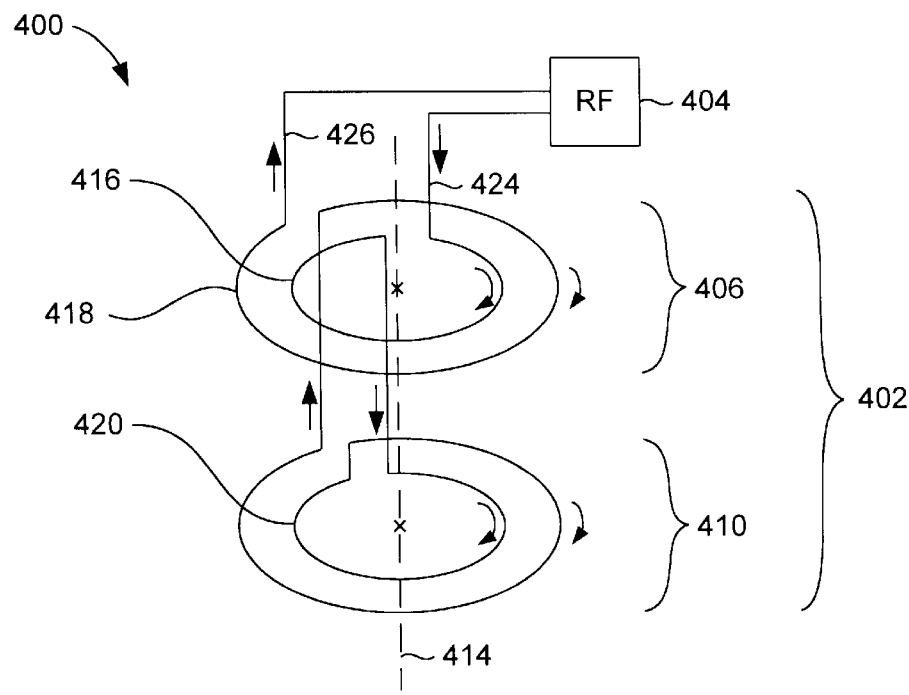
FIG. 3 illustrates the multi-turn antenna arrangement, in accordance with one embodiment of the present invention.
Figure 4:
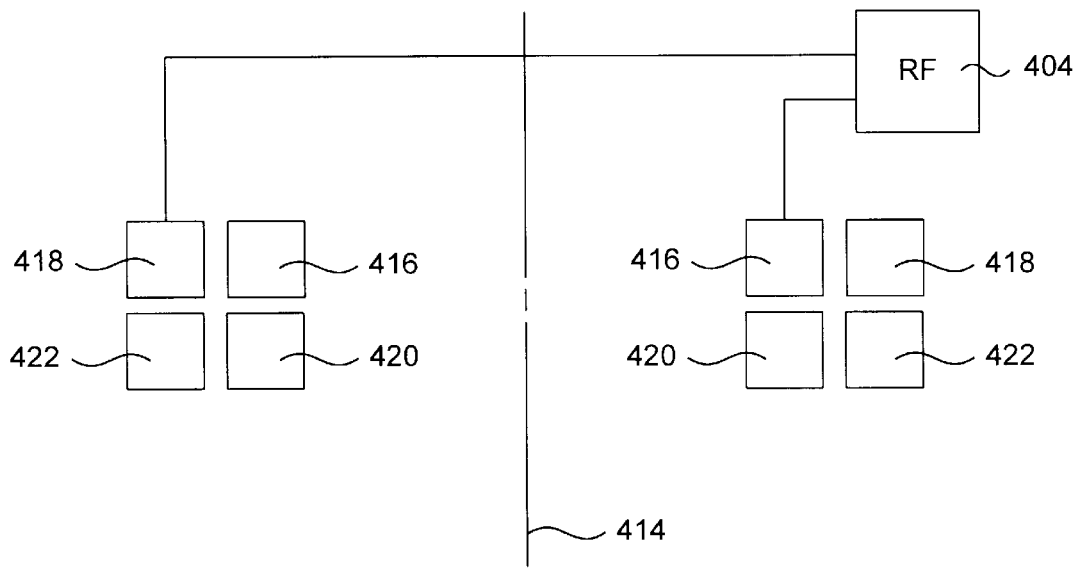
FIG. 4 is a cross sectional side view of the multi-turn antenna arrangement, in accordance with one embodiment of the present invention.

According to a first aspect of the invention, the plasma processing apparatus is provided with a multi-turn antenna arrangement such that an azimuthally symmetric electric field is induced inside the process chamber of the plasma processing apparatus. FIGS. 3 & 4 illustrate a multi-turn antenna arrangement 400, in accordance to one embodiment of the present invention. The multi-turn antenna arrangement 400 includes a multi-turn antenna 402 operatively coupled to a RF power source 404 which, for example, respectively correspond to the antenna 210 and the RF power source 214 illustrated in FIG. 2.

As mentioned, if the antenna length is small with respect to the wavelength then the transmission line description of the power coupling is no longer appropriate, and the power coupling begins to behave as a lumped circuit element. Therefore, multi-turn antenna 402 is configured to have a length that is smaller than the wavelength of the transmitted energy. By decreasing the length of the antenna, fewer nodes are created in the standing wave pattern, and as a result the high voltage and low voltage areas in the azimuthal direction of the antenna are substantially reduced.

The multi-turn antenna is preferably configured to have multiple turns that are closely disposed together so the electromagnetic field that is produced appears to be from a single turn antenna. More specifically, by placing the turns closer together the current producing capacity of the antenna is increased. For example, if the antenna is formed of four turns that are proximal to one another then the current through the plasma tends to be about four times as strong as in the antenna. Correspondingly, this concentrated current carries over to a concentrated plasma that is more uniform. As a result, the diameter of the antenna, with respect to the diameter of the process chamber, can be made smaller, which in turn decreases the length of the antenna. The actual size of the antenna will be described in greater detail below.

Multi-turn antenna 402 is substantially circular and includes at least a first pair of concentric loops 406 in a first plane and a second pair of concentric loops 410 in a second plane. Preferably, the first pair of concentric loops 406 and the second pair of concentric loops 410 are substantially identical and symmetrically aligned with one another along an antenna axis 414. It should be noted that a substantially circular antenna will produce a substantially circular electric field, which as result will produce a substantially circular plasma. Accordingly, because the process chamber and the substrate are circular it stands to reason that the substantially circular plasma tends to create more uniform processing at the surface of the substrate.

While the present invention has been shown and described as being substantially circular, it should be understood that alternate shapes for applications requiring different shaped substrates such as for displays or for compensation of some asymmetry in chamber design may be used. By way of example, oval shapes, or rectangular shapes with circular corners following the same principles set forth above may also work well.

Furthermore, the first pair of concentric loops 406 are preferably stacked above the second pair of concentric loops 408. Single-plane antennas typically produce an increased amount of capacitive coupling because the terminal voltage and all of the voltage nodes are in direct proximity with the window. However, because of the stacked antenna and the symmetric alignment between the first pair of concentric loops and the second pair of concentric loops, the high terminal voltage is advantageously shielded by the second pair of concentric loops. More specifically, the voltage drop (e.g., capacitive coupling) that would typically occur between the first concentric loop and the plasma is substantially reduced because the second pair of concentric loops provides a conductive path for the voltage drop and therefore the voltage drop will not interact with the plasma.

Additionally, first pair of concentric loops 406 preferably include a first turn 416 and a fourth turn 418, and second pair of concentric loops 410 preferably include a second turn 420 and a third turn 422. Further, first turn 416 is substantially identical to and disposed above second turn 420, and fourth turn 418 is substantially identical to and disposed above third turn 422.

First turn 416 is operatively coupled to second turn 420, second turn 420 is operatively coupled to third turn 422, and third turn 422 is operative coupled to fourth turn 418, with each of the turns being arranged so that the current flow is in the same direction around antenna axis 414. In one implementation, the multi-turn antenna is formed from a single conductive element. However, it should be noted that this is not a limitation and that the multi-turn antenna may be formed from separate parts that are structurally and electrically coupled together. Additionally, multi-turn antenna 402 includes an input lead 424 and an output lead 426. The input lead 424 is operatively coupled to first turn 416, and the output lead 426 is operatively coupled to fourth turn 418. Accordingly, RF current is made to flow through multi-turn antenna 402 by applying an RF voltage between the input lead 424 and the output lead 426.

Still referring to FIGS. 3 & 4, fourth turn 418 has a larger diameter than first turn 416, and third turn 422 has a larger diameter than second turn 420. Although the outer turns (e.g., third and fourth turns), have larger diameters they are preferably disposed proximate to the inner turns (e.g.,, first and second turns). That is, the fourth turn 418 is preferably arranged to be proximate to the first turn 416, and the third turn 418 is preferably arranged to be proximate to the second turn 420. As a result of their close proximity, the multi-turn antenna looks and acts like a single turn antenna (e.g., substantially no space between turns). Accordingly, the high or low current areas in the radial direction are substantially reduced.

As is well known to those skilled in the art, a small space between two conductors will typically create arcing between the two conductors. Therefore, the space between the outer and inner turns is limited by a distance that eliminates arcing. However, in one implementation of the present invention, the space is filled with a dielectric material to allow the inner and outer turns to be disposed as close as possible to one another, while substantially eliminating arcing between the inner and outer turns. By way of example, Teflon or ceramic materials having a space between about 0.2 to about 1 cm. work well.

Furthermore, the multi-turn antenna is generally formed from copper. In one implementation, the multi-turn antenna is formed from copper coated with silver. However, it should be noted that the multi-turn antenna is not limited by copper or copper coated with silver and that any suitable conductive metal may be used. In one embodiment, the cross section of the antenna loop is rectangular to facilitate a repeatable location of each loop with respect to the window and each other loop. However, it should be noted that the this is not a limitation and that other cross sectional shapes and sizes may be used. Alternatively, the antenna loop may be formed from a hollow conductor to facilitate temperature control (i.e., flowing a fluid therethrough).

With respect to the overall size of the multi-turn antenna, i.e., the outer diameter, it is generally preferable (but not absolutely necessary) to size the antenna to be smaller than the cross-section of the process chamber in order to keep the plasma concentrated in the region above the substrate and to prevent undue plasma diffusion to the chamber walls, which disadvantageously requires more power to operate the plasma processing system and increases wall erosion. Furthermore, the size of the plasma to be generated generally corresponds to the size of the antenna used, and therefore, the multi-turn antenna should have an outer diameter that is substantially similar to the diameter of the substrate in order to produce a uniform etch rate. By way of example, the size of the substrates are typically between about 6 to about 12 inches, and therefore in one embodiment, the multi-turn antenna has an outer diameter between about 6 to about 12 inches.

To elaborate further, because of the increased current capacity, i.e., multi-turn antenna that acts like a single turn, the multi-turn antenna may be configured to be smaller than the substrate. That is, the higher concentration of current tends to produce a plasma that is large enough to process the substrate. It should be understood however that the use of smaller antennas may not be required for all processes, i.e., an antenna may be configured to be larger than the substrate. However, if a high degree of uniformity is critical, the use of smaller antennas can be quite beneficial. By way of example, the diameter of the antenna may be configured to be between about 6 to about 15 inches, and preferably between about 7 to about 11 inches, in order to process a 12 inch substrate. It should be noted, however, that this is not a limitation and that the actual size of the antenna may vary according to the specific size of the substrate (e.g., the antenna size may be scaled as needed when smaller or larger substrates are involved) and the specific design of each plasma processing system.

With respect to the RF frequency employed, as a general guideline, a lower RF frequency (e.g., less than 13 MHz) tends to decrease the effects of the transmission line characteristics of the power coupling by reducing standing wave effects. That is, a lower frequency tends to make any inherent azimuthally asymmetric coupling characteristic of an antenna less pronounced. Furthermore, at a lower RF frequency, the capacitive coupling between the antenna and the plasma is also less pronounced, and therefore ion bombardment of the coupling window is reduced. Therefore, the frequency of the RF power source is generally configured to be less than or equal to about 13 MHz, preferably between about 0.4 MHz and about 13 MHz, and more preferably, at about 4 MHz. It should be understood that the use of lower frequencies may not be required for all processes. However, if a high degree of uniformity is critical, the use of low frequencies can be quite beneficial.

As can be seen from the foregoing, the advantages of the first aspect of the invention are numerous. Different embodiments or implementations may have one or more of the following advantages. One advantage of the invention is that an azimuthally symmetric plasma is produced inside the process chamber. As a result, increased process uniformity is achieved, which increases substrate throughput, reduces device failure, and increases the overall productivity of the substrates being processed. Another advantage of the invention is that the inventive antenna arrangement is self shielding, and therefore the capacitive coupling between the antenna and the plasma is reduced. Correspondingly, the ion bombardment of the coupling window is reduced, and therefore the life of the coupling window is increased, and particle contamination associated with ion bombardment is reduced.

Figure 5:
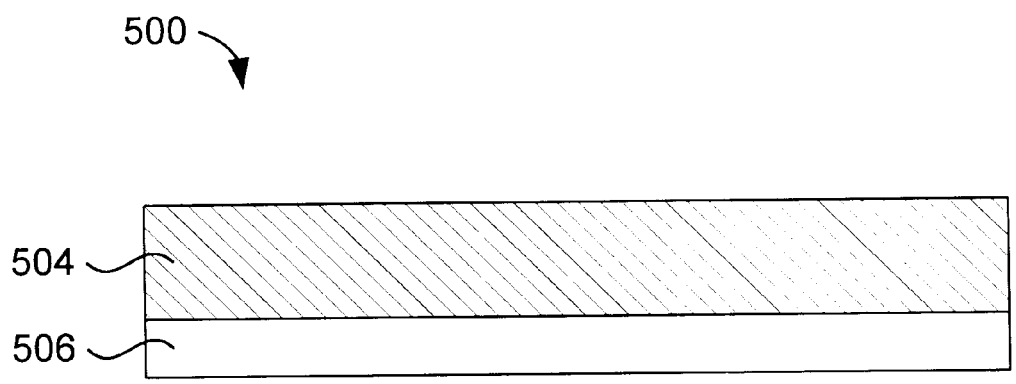
FIG. 5 is a cross sectional side view of the multi-layered coupling window, in accordance with one embodiment of the present invention.

According to a second aspect of the invention, a plasma processing apparatus is provided with a multi-layered coupling window arrangement to substantially reduce capacitive coupling between the antenna and the plasma. To facilitate discussion of this aspect of the present invention, FIG. 5 illustrates a multi-layered coupling window arrangement 500, in accordance with one embodiment of the present invention. The multi-layered coupling window arrangement 500 may respectively correspond to the coupling window 212 illustrated in FIG. 2. Multi-layered coupling window 500 includes at least a first layer 504 and a second layer 506. Preferably, first layer 504 is bonded to second layer 506. In one implementation, the two layers are thermally bonded together. However, it should be noted that a this is not a limitation and that other bonding processes may be used. Alternatively, it should be noted that a gap may be disposed between the layers, i.e., a vacuum gap or a gap to allow gas flow between the layers, while still obtaining the benefits described. Furthermore, second layer 506 preferably forms part of the inner peripheral surface of the process chamber.

Referring first to the second layer, the second layer is configured to act as an electrostatic shield that reduces the potential difference on its surface. Further, the second layer is arranged to be electrically isolated and preferably formed from a conducting or semi-conducting material that can facilitate the passage of inductive RF energy from the antenna to the plasma. Additionally, because the second layer is exposed to the plasma inside the process chamber, the second layer is preferably formed from a material that is substantially resistant to a plasma. In a preferred embodiment, the second layer is formed from Silicon Carbide (SiC). For the most part, SiC can resist the thermal, chemical and physical effects of plasma processing. In addition, SiC is generally classified as a dielectric, yet yields some resistance to the flow of current. The resistive property is what produces the shielding effect, and the dielectric property is what allows inductive coupling.

The resistivity of the second layer is an important parameter for ensuring that the layer act as an electrostatic shield, while not impacting the inductive electric field. For the most part, the particular resistivity range to be used in the invention depends on the exact dimensions of the antenna with which the coupling window is being used, the operating frequency of the power coupling and the thickness of the second layer. By way of example, a resistivity from about 100 ohm-cm to about 10 kohm-cm works well. However, it should be understood that if desired, the resistivity can be configured to be greater than $10^6$ ohm-cm to make the second layer (e.g., SiC) act more like a dielectric layer.

While not wishing to be bound by theory, it is believed that the electrical resistance of the second layer presents an equipotential surface to the process gas used to form the plasma. For example, after ignition of the plasma, the potential on the second layer is substantially reduced due to the proximity of the plasma to the second layer. Furthermore, a capacitive voltage divider is generally formed, for example, an upper part, which is formed by the dielectric first layer having a constant capacitance, and a lower part, which is formed by the conductive second layer and the chamber walls before ignition and the conductive second layer and the plasma after ignition. Before ignition the lower part has a small capacitance, and therefore there is a large voltage aiding ignition (e.g., in order to initiate the discharge, a capacitive electric field is typically necessary). After ignition the lower part has a large capacitance such that the voltage is substantially reduced, and therefore it does not lead to significant capacitive power coupling.

Referring now to the first layer, the first layer is preferably formed from a dielectric material that can facilitate the passage of inductive RF energy from the antenna to the plasma. Further, the first layer is configured to be strong enough to structurally hold vacuum and robust enough to be easily handled during periodic cleaning of the chamber. Additionally, the first layer is generally formed from a dielectric material that has superior thermal properties to enable temperature control of the window. By way of example, dielectric materials formed from Silicon Nitride (SiN) or Aluminum Nitride (AlN) work well. However, it should be understood that this is not a limitation and that other materials may be used. For example, alumina and quartz may also work well.

The overall thickness of the multi-layer coupling window 500 is configured to be thin enough to effectively transmit the antenna RF energy to the plasma, while being sufficient to withstand the pressures and heat that are generated during processing. Preferably, the thickness of the multi-layer coupling window is between about 0.5 and about 1 inch. More preferably, the thickness of the multi-layer coupling window is about 0.8 inches. Further, the first layer 504 should have a thickness greater than the second layer 506. Preferably, the thickness of the first layer is between about 0.5 and about 1 inches. More preferably, the thickness of the first layer is about 0.6 inches. Furthermore, the thickness of the second layer is preferably between about 0.1 and about 0.5 inches. More preferably, the thickness of the second layer is about 0.2 inches. It should be understood that the actual thickness of layers may vary according the specific material chosen for each layer.

In one embodiment, the second layer is configured to cover the entire first layer to protect the first layer from plasma exposure, and to ensure that pure materials (e.g., SiC) face the plasma region that is in contact with the substrate. However, it should be noted that this is not a limitation and that other configurations may be used. For example, the second layer may be configured to cover only those portions of the first layer that face the plasma near the antenna.

Note that there is no requirement that the size of the coupling window be equal to the size of the plasma processing chamber. In general, however, a small coupling window may reduce cost, particular when expensive materials such as SiC are employed. In one embodiment, the shape of the window coupling is configured to coincide with the shape of the antenna arrangement, and therefore, the coupling window is configured to be substantially circular. In another embodiment, the outer dimensions of the coupling window may be configured to extend a small distance beyond the outer dimensions of the antenna, in order to reduce any coupling to electrically conductive elements which may encircle the antenna. In one example, the outer dimensions of the coupling window is arranged to extend about 1 inch past the outer dimensions of the antenna. In yet another embodiment, the coupling window may have a shape that is substantially the same as the antenna, i.e., hoop shaped.

With respect to the dielectric properties (e.g., dielectric constant) employed, as a general guideline, a lower dielectric constant, e.g., less than about 10 tends to decrease the effects of the transmission line characteristics of the power coupling by reducing standing wave effects. More specifically, a lower dielectric constant tends to make the wavelength of the transmitted energy longer, which makes the antenna look shorter and therefore fewer nodes are created in the standing wave pattern. Accordingly, a lower dielectric constant tends to make any inherent azimuthally asymmetric coupling characteristic of an antenna less pronounced.

In one embodiment, the overall dielectric constant of the coupling window is preferably configured to be less than or equal to about 10. It should be understood that the use of lower dielectric constants may not be required for all processes. In fact, a compromise between the desire for highly azimuthal symmetry and the simplicity of structural and thermal design is typically needed. However, if a high degree of uniformity is critical, the use of low dielectric constants can be quite beneficial.

As can be seen from the foregoing, the advantages of the second aspect of the invention are numerous. Different embodiments or implementations may have one or more of the following advantages. For example, the invention provides a coupling window that substantially reduces the capacitive coupling between the antenna and the plasma. As a result, variations in the plasma are substantially reduced. For example, the inductive coupling coefficient is typically maintained, the ion bombardment of the coupling window is generally reduced, and more power is available for plasma generation, i.e., a higher plasma density for a given power. Furthermore, because ion bombardment is reduced, particle contamination associated with ion bombardment is generally reduced, and as a result, process variations associated with a varying thickness window (i.e., deposits or removed material) are decreased. Additionally, the present invention utilizes pure materials, i.e., SiC, which tend to reduce process variations.

Furthermore, it is contemplated that additional elements may be employed, along with the aforementioned multi-turn antenna and multi-layered coupling window, to further enhance the uniform processing of a substrate in a plasma processing system. By way of example, a magnetic arrangement can be arranged with the multi-turn antenna to control the radial variation of the static magnetic field within the process chamber in the region proximate the coupling window and the multi-turn antenna. An example of such an magnetic arrangement may be found in co-pending patent application entitled, "IMPROVED PLASMA PROCESSING SYSTEMS AND METHODS THEREFOR". U.S. patent application Ser. No. 09/439,661, filed on Nov. 15, 1999 and incorporated herein by reference.

Figure 6:
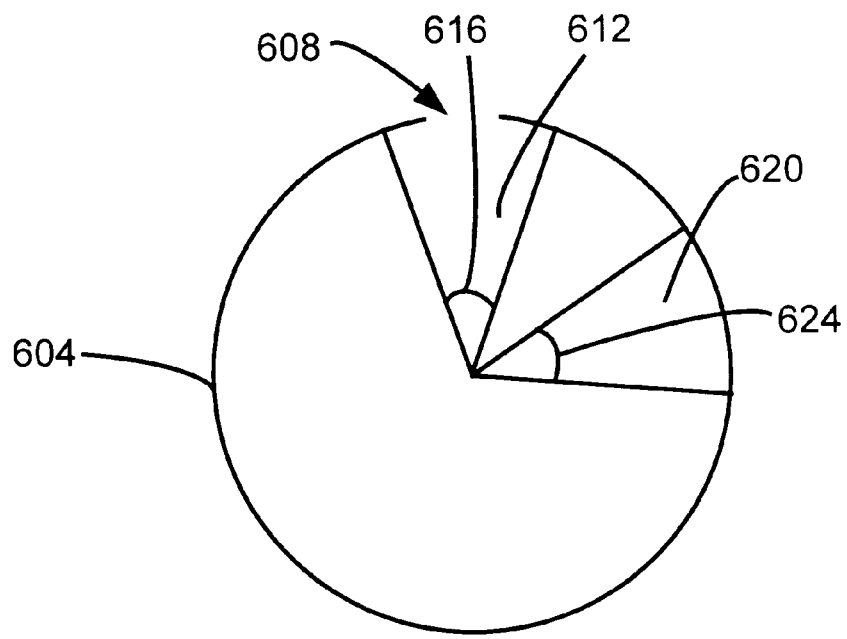
FIG. 6 is a schematic illustration of a partial antenna turn with a gap.

As critical dimensions continue to decrease the tolerances for a plasma that is not azimuthally symmetric also decrease. The antenna turns are incomplete and gaps are provided between the ends of the antenna loops to prevent shorting. Such a gap may prevent the plasma from being azimuthally symmetric. FIG. 6 is a schematic illustration of a partial antenna turn 604 with a gap 608. A first azimuthal sector 612 defined by a first angle 616 contains the gap 608. A second azimuthal sector 620 defined by a second angle 624 does not contain the gap 608. The gap 608 causes the RF power in the first azimuthal sector 612 to be less than the RF power in the second azimuthal sector 620. Various current carrying elements have been used to bridge the gap. The nonsymmetry of such bridging elements may make such elements unable to provide a desired uniformity.

Figure 7:
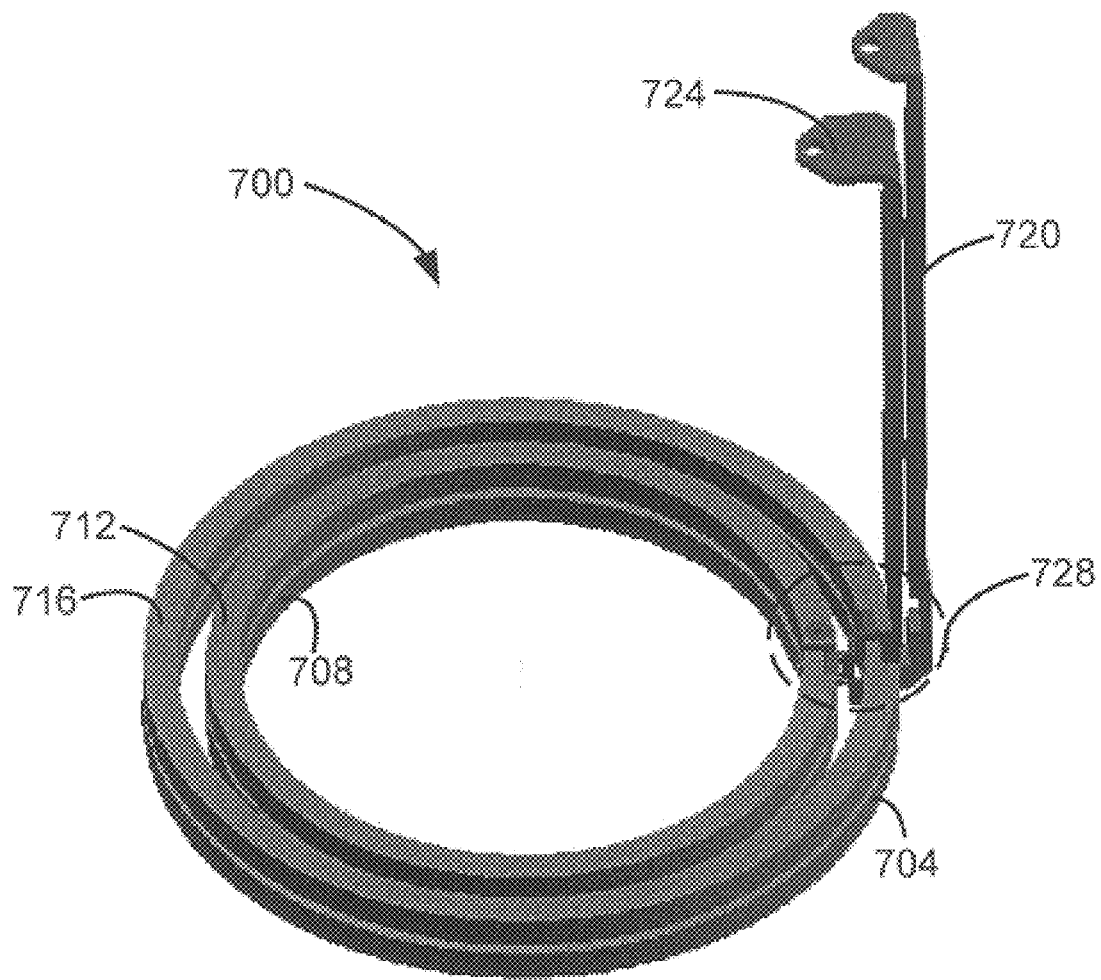
FIG. 7 is a perspective view of a multi-turn antenna provided by an embodiment of the invention.
Figure 8:
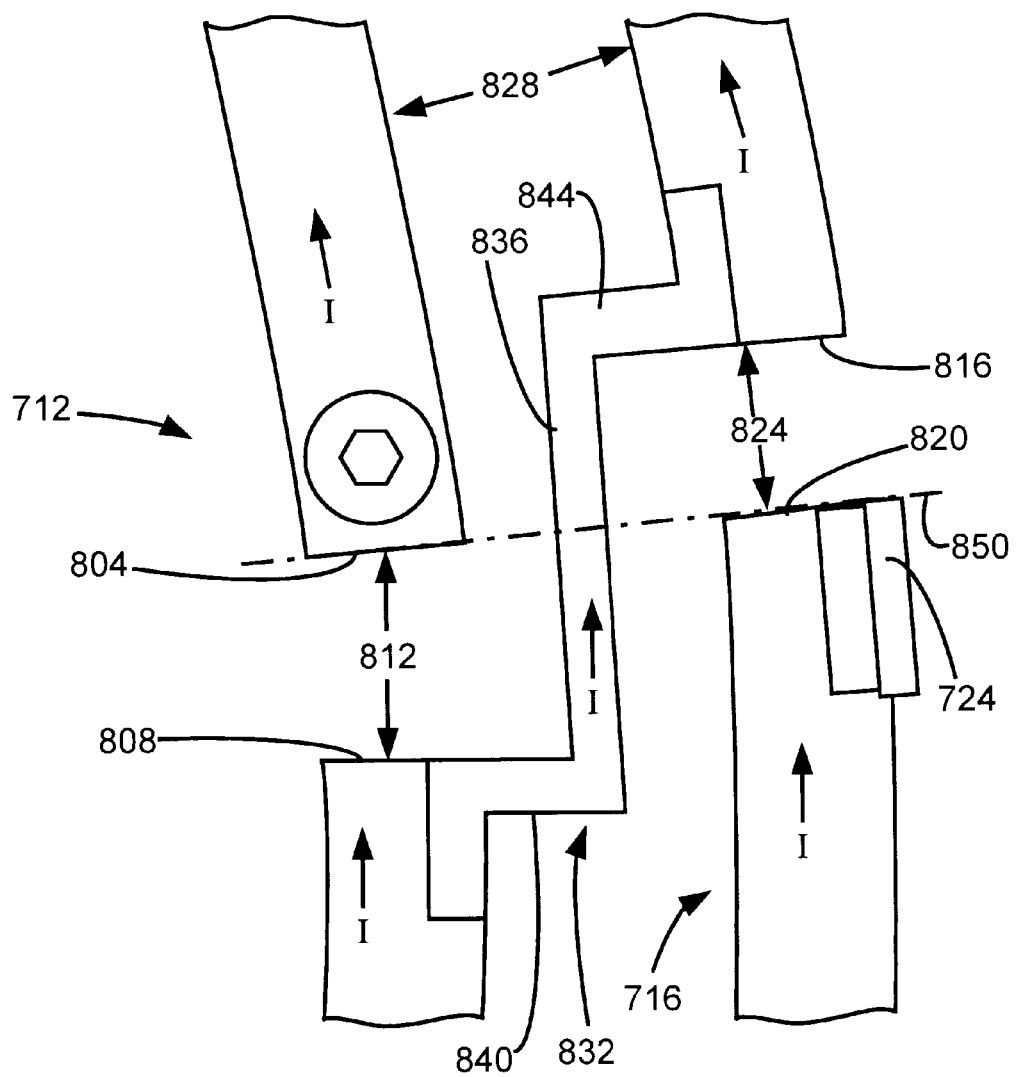
FIG. 8 is an enlarged schematic top view of a section of a third turn, a fourth turn, and an output bus.
Figure 9:
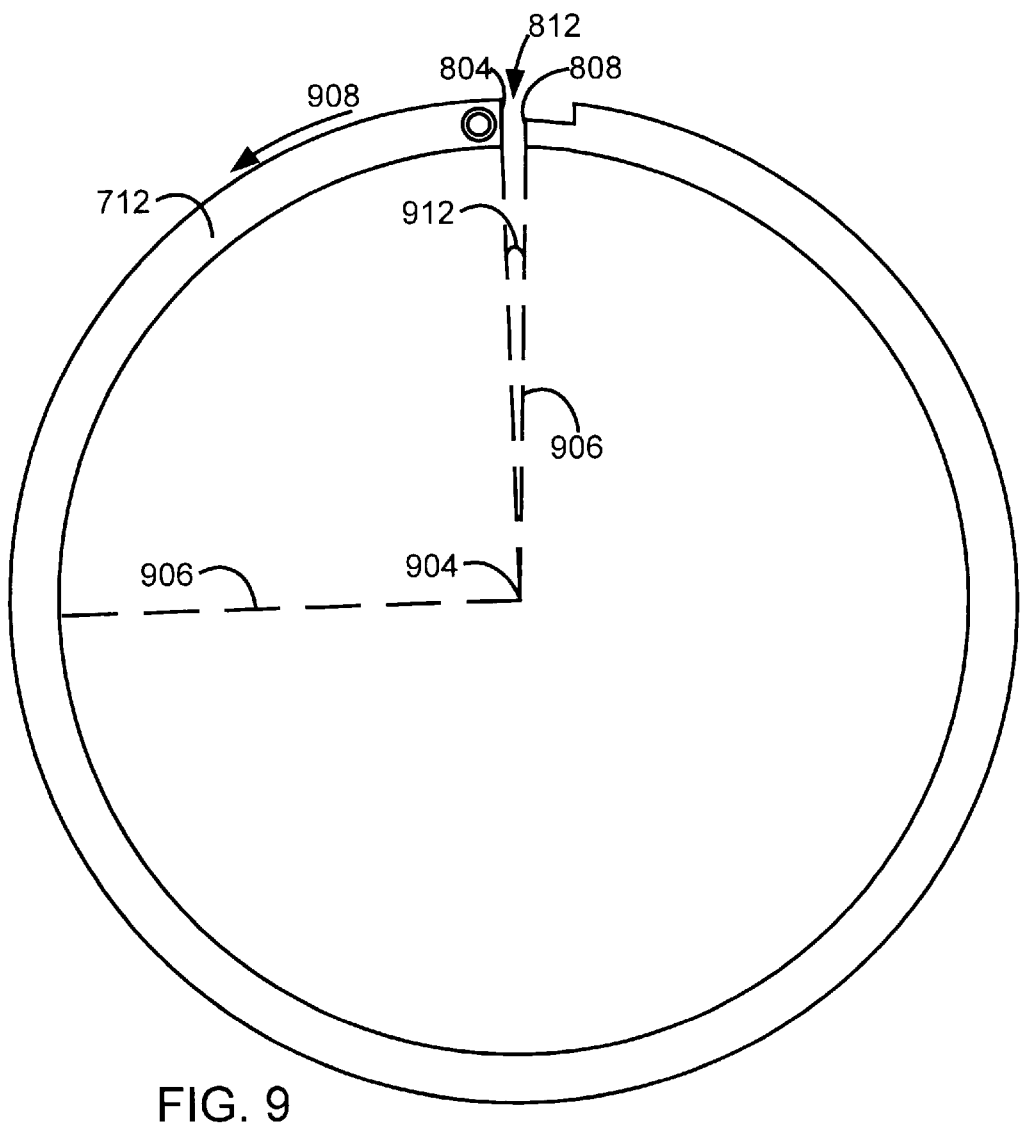
FIG. 9 is a top view of the third turn.

FIG. 7 is a perspective view of a multi-turn antenna 700 provided by an embodiment of the invention. The multi-turn antenna 700 comprises a first turn 704, a second turn 708, a third turn 712, and a fourth turn 716. An input bus 720 is connected to the first turn 704. An output bus 724 is connected to the fourth turn 712. FIG. 8 is an enlarged schematic top view of cut out section 728 of FIG. 7, which shows a section of the third turn 712, the fourth turn 716, and the output bus 724. The first turn, second turn, and input bus 720 are not shown in FIG. 8 for clarity. FIG. 9 is a top view of the third turn 712 alone. As shown in FIG. 8 and FIG. 9, the third turn 712 has a first end 804 and a second end 808, where the first end 804 and the second end 808 of the third turn 712 are separated by a third turn gap 812. The third turn 712 is centered on the antenna axis 904. The radius 906 of the third turn 712 extends from the antenna axis 904 to a point on the third turn 712. The circumference 908 of the third turn 712 is the direction along the third turn from the first end 804 along the third turn 712 to the second end 808 of the third turn across the gap 812 back to the first end 804 of the third turn 712. Preferably, the gap 812 is only a small part of the third turn 712. In some of these views, elements such as the gap 812 may not be drawn to scale so that certain elements may be more clearly illustrated. The gap 812 forms an angle 912 with the antenna axis, as shown. Preferably, the angle 912 formed by the gap 812 is less than 7°. More preferably, the angle 912 formed by the gap is less than 5°. More preferably, the angle formed by the gap is less than 3°. The length of the third turn gap 812 is substantially parallel to the circumference of the third turn 712. The distance between at least part of the first end 804 of the third turn and the antenna axis 904 is equal to the distance between at least part of the second end 808 of the third turn and the antenna axis 904. This means that a radius to a point between the inner part of the first end of the third turn and the outer part of the first end is equal to a radius to a point between the inner part of the second end of the third turn. and the outer part of the second end 808 of the third turn. Turns that form part of a spiral would not fall within this definition, since parts over a turn of a spiral the first ends and second ends must have such a different radii so that the ends do not meet. More preferably, the radius of the first end 804 is equal to the radius of the second end 808, as shown in FIG. 9. Preferably, the third turn 712 is substantially circular. More preferably, the third turn 712 is circular, as shown.

Figure 10:
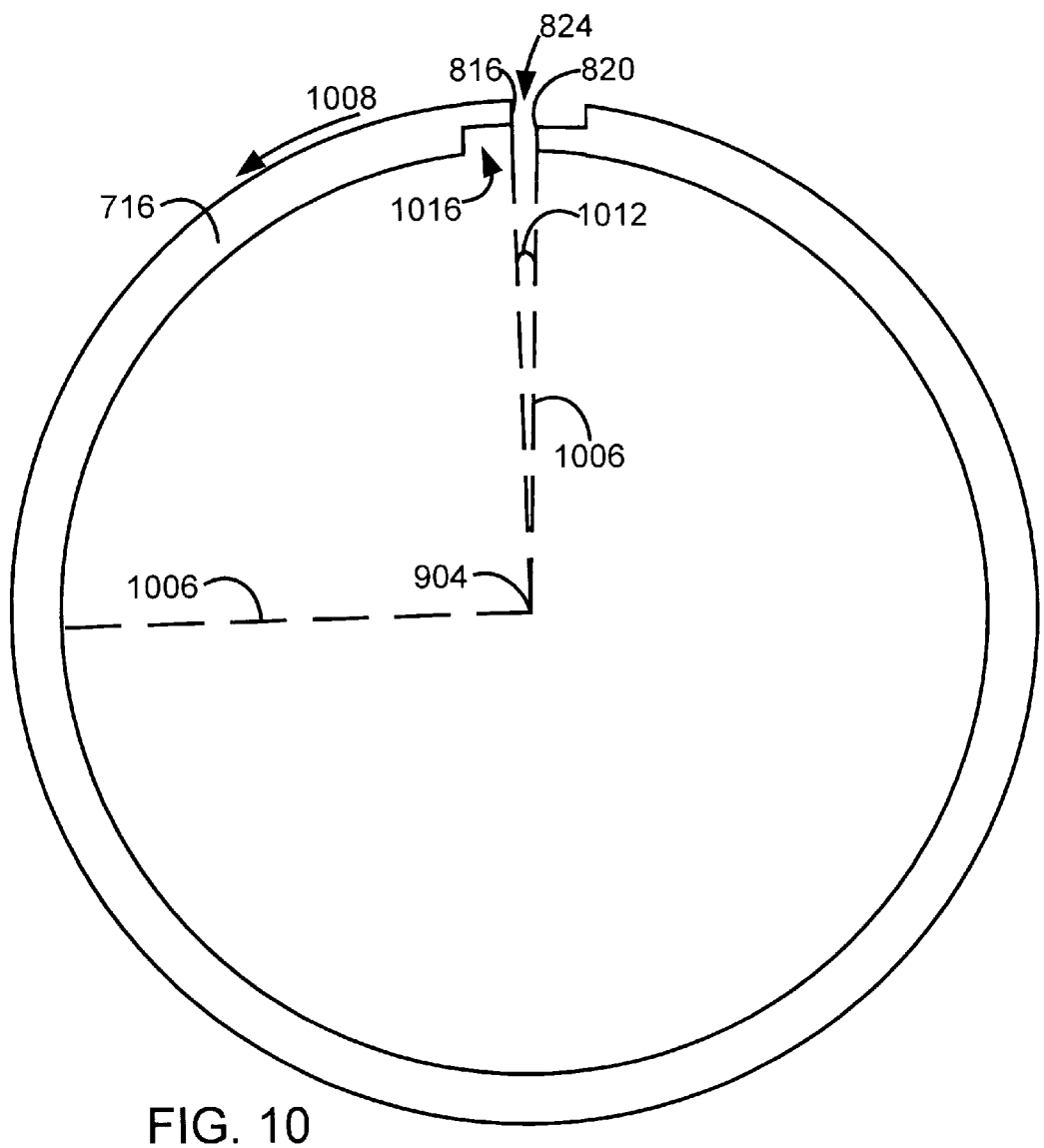
FIG. 10 is a top view of the fourth turn.

FIG. 10 is a top view of the fourth turn 716 alone. As shown in FIG. 8 and FIG. 10, the fourth turn 716 has a first end 816 and a second end 820, which are separated by a fourth turn gap 824. The third turn 712 is separated from the fourth turn 716 by a third turn-fourth turn gap 828. The length of the third turn-fourth turn gap 828 is radial to the third turn 712 and fourth turn 716, which is substantially perpendicular to the tangents of the third and fourth turns 712, 716. The fourth turn 716 is centered on the antenna axis 904. The third turn 712 and fourth turn 716 are concentric and coplanar, so that they are centered around the same point on the antenna axis 904. The radius 1006 of the fourth turn 716 extends from the antenna axis 904 to a point on the fourth turn 716, so that the fourth turn 716 has a larger radius than the third turn 712 by about the size of the third turn-fourth turn gap 828. The circumference 1008 of the fourth turn 716 is the direction along the fourth turn from the first end 816 along the fourth turn 716 to the second end 820 of the fourth turn across the gap 824 back to the first end 816 of the fourth turn 716. Preferably, the gap 824 is only a small part of the fourth turn 716. The gap 824 forms an angle 1012 with the antenna axis, as shown. Preferably, the angle 1012 formed by the gap 824 is less than 7°. More preferably, the angle 1012 formed by the gap is less than 5°. More preferably, the angle formed by the gap is less than 3°. The length of the fourth turn gap 824 is substantially parallel to the circumference of the fourth turn 716. In this example, the first end 816 and second end 820 have a cut out corner sections 1016. The distance between at least part of the first end 816 of the fourth turn and the antenna axis 904 is equal to the distance between at least part of the second end 820 of the fourth turn and the antenna axis 904. This means that a radius to a point between the inner part of the first end of the fourth turn and the outer part of the first end is equal to a radius to a point between the inner part of the second end of the fourth turn and the outer part of the second end 820 of the fourth turn, where the inner part of the first end is defined to include the cut out corner section 1016 of the first end as if the first end was not cut out and wherein the outer part of the second end is defined to include the cut out corner section of the second end as if the second end was not cut out, since such cut outs are only so that a connector may be mounted therein so that during use the cut outs are actually filled in. Turns that form part of a spiral would not fall within this definition, since parts over a turn of a spiral the first ends and second ends must have such a different radii so that the ends do not meet. More preferably, the radius of the first end 816 is equal to the radius of the second end 820, as shown in FIG. 10. Preferably, the fourth turn 716 is substantially circular. More preferably, the fourth turn 716 is circular, as shown.

A third turn-fourth turn connector 832 provides an electrical connection between the second end of the third turn 808 and the first end of the fourth turn 816. In the preferred embodiment the third turn-fourth turn connector 832 comprises a spanning section 836, a third turn connector leg 840, and a fourth turn connector leg 844. Preferably, the spanning section 836 is substantially parallel to the circumference of the third turn 712 and the circumference of the fourth turn 716 adjacent to the spanning section 836. The third turn connector leg 840 is substantially radial to the third turn 712. The meaning of the third turn connector leg being substantially radial to the third turn means being substantially parallel to the radius of the part of the third turn adjacent to the third turn connector leg. The fourth turn connector leg 844 is substantially radial to the fourth turn 716. The spanning section 836 is approximately midway between the third turn 712 and the fourth turn 716, as shown. The third turn connector leg 840 is adjacent to an end of the third turn gap 812. The fourth turn connector leg 844 is adjacent to an end of the fourth turn gap 824. In the preferred embodiment, the third turn gap 812 and the fourth turn gap 824 are adjacent to each other, so that an end of the third turn gap 812 is along a radius as indicated by broken line 850, which coincides with the beginning of the fourth turn gap 824. This allows the gaps to be adjacent without overlapping, as shown. Other variations may allow the gaps 812, 824 to overlap by a distance preferably between 0.0625 inches (1.5875 mm) and −0.0625 inches (−1.5875 mm), where the negative value means that there is no overlap, but instead the gaps are separated so that measured along the third turn the radius that ends the third gap and the radius that begins the fourth gap are separated by less than 0.0625 inches. More preferably, the overlap of the third and fourth gap is between 0.005 inches (0.127 mm) and −0.005 inches (−0.127 mm). In terms of percentage, the overlap of the third and fourth turn gaps is between 50% and −50% of the length of the third turn gap, where the negative value means that there is no overlap, but instead the gaps are separated so that measured along the third turn the radius that ends the third gap and the radius that ends the fourth turn gap are separated by less than 50% of the third turn gap length. More preferably, the overlap of the third and forth turn gaps is between 25% and −25% of the third turn gap length. Most preferably, the overlap of the third and fourth turn gaps is between 5% and −5%. The connector 832 is coplanar with the third turn 712 and the fourth turn 716.

Figure 11:
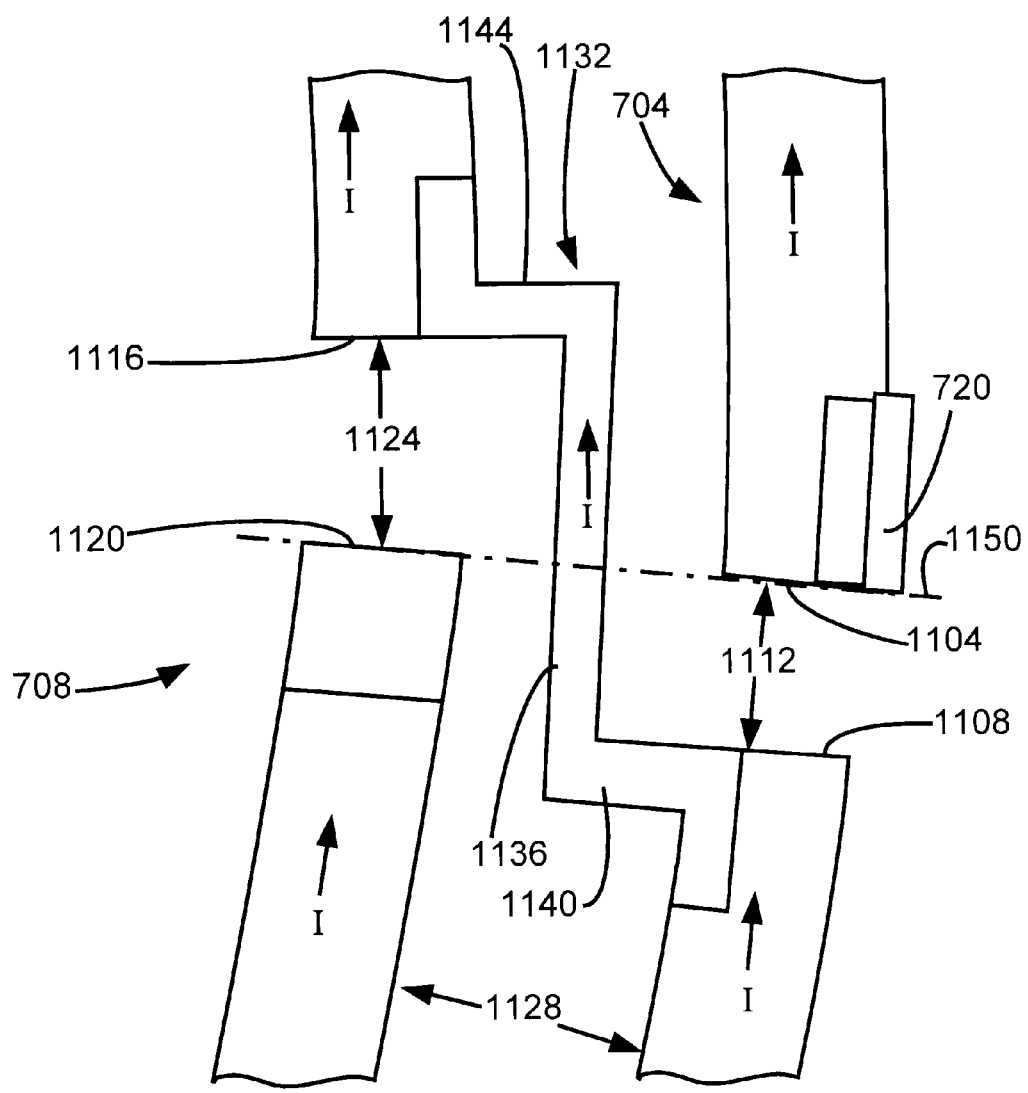
FIG. 11 is an enlarged schematic top view of s a section of a first turn, a second turn, and an input bus.
Figure 12:
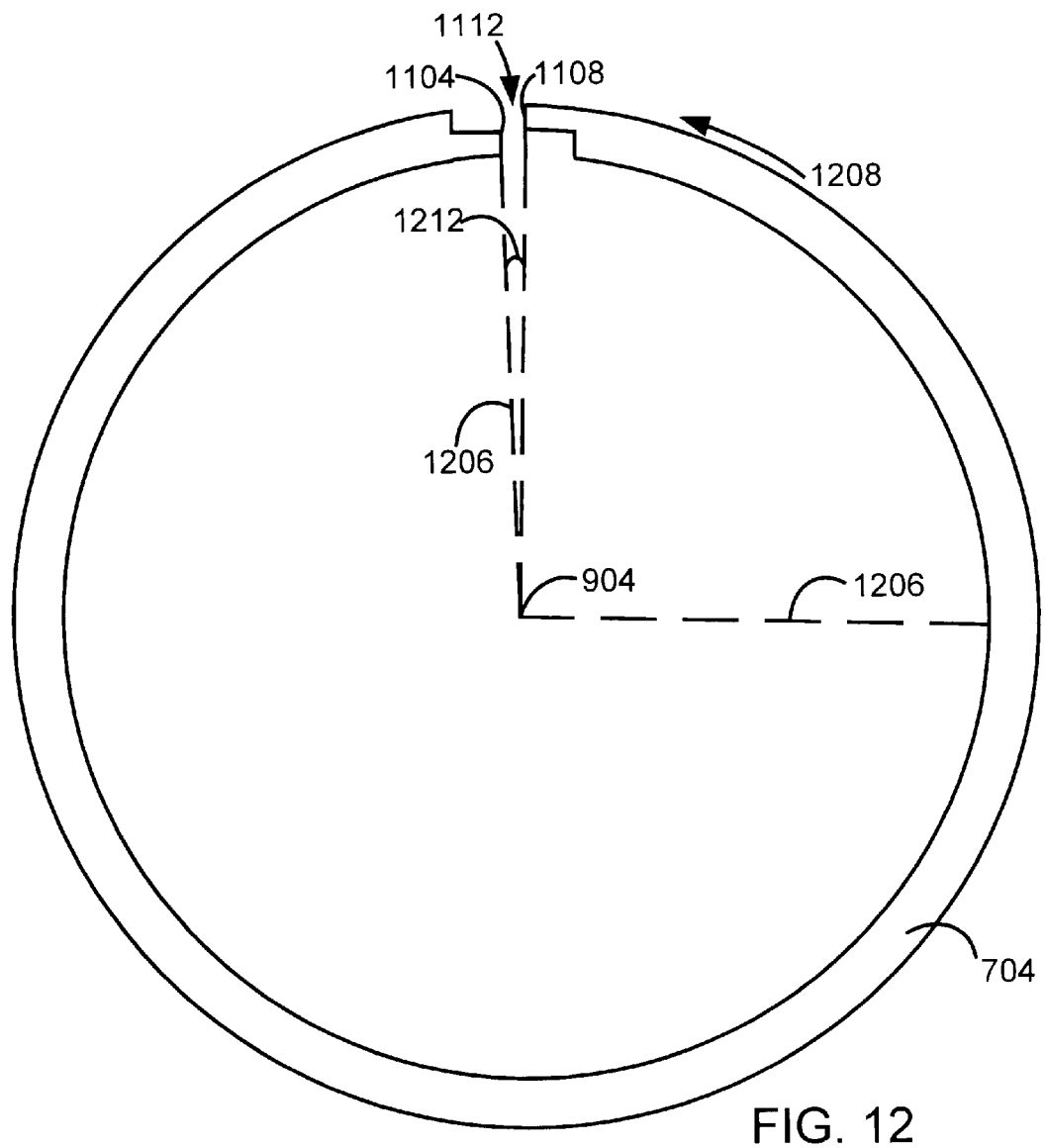
FIG. 12 is a top view of the first turn.

FIG. 11 is an enlarged schematic top view of cut out section 728 of FIG. 7, which shows a section of the first turn 704, the second turn 708, and the input bus 720, where the third turn, fourth turn, and output bus are not shown in FIG. 11 for clarity. FIG. 12 is a top view of the first turn 704 alone. As shown in FIG. 11 and FIG. 12, the first turn 704 has a first end 1104 and a second end 1108, where the first end 1104 and the second end 1108 of the first turn 704 are separated by a first turn gap 1112. The first turn 704 is centered on the antenna axis 904. The radius 1206 of the first turn 704 extends from the antenna axis 904 to a point on the first turn 704. The circumference 1208 of the first turn 704 is the direction along the first turn from the first end 1104 along the first turn 704 to the second end 1108 of the first turn across the gap 1112 back to the first end 1104 of the first turn 704. Preferably, the gap 1112 is only a small part of the first turn 704. The gap 1112 forms an angle 1212 with the antenna axis, as shown. Preferably, the angle 1212 formed by the gap 1112 is less than 7°. More preferably, the angle 1212 formed by the gap is less than 5°. More preferably, the angle formed by the gap is less than 3°. The length of the first turn gap 1112 is substantially parallel to the circumference of the first turn 704. The distance between at least part of the first end 1104 of the first turn and the antenna axis 904 is equal to the distance between at least part of the second end 1108 of the first turn and the antenna axis 904. More preferably, the radius of the first end 1104 is equal to the radius of the second end 1108, as shown in FIG. 12. Preferably, the first turn 704 is substantially circular. More preferably, the first turn 704 is circular, as shown.

Figure 13:
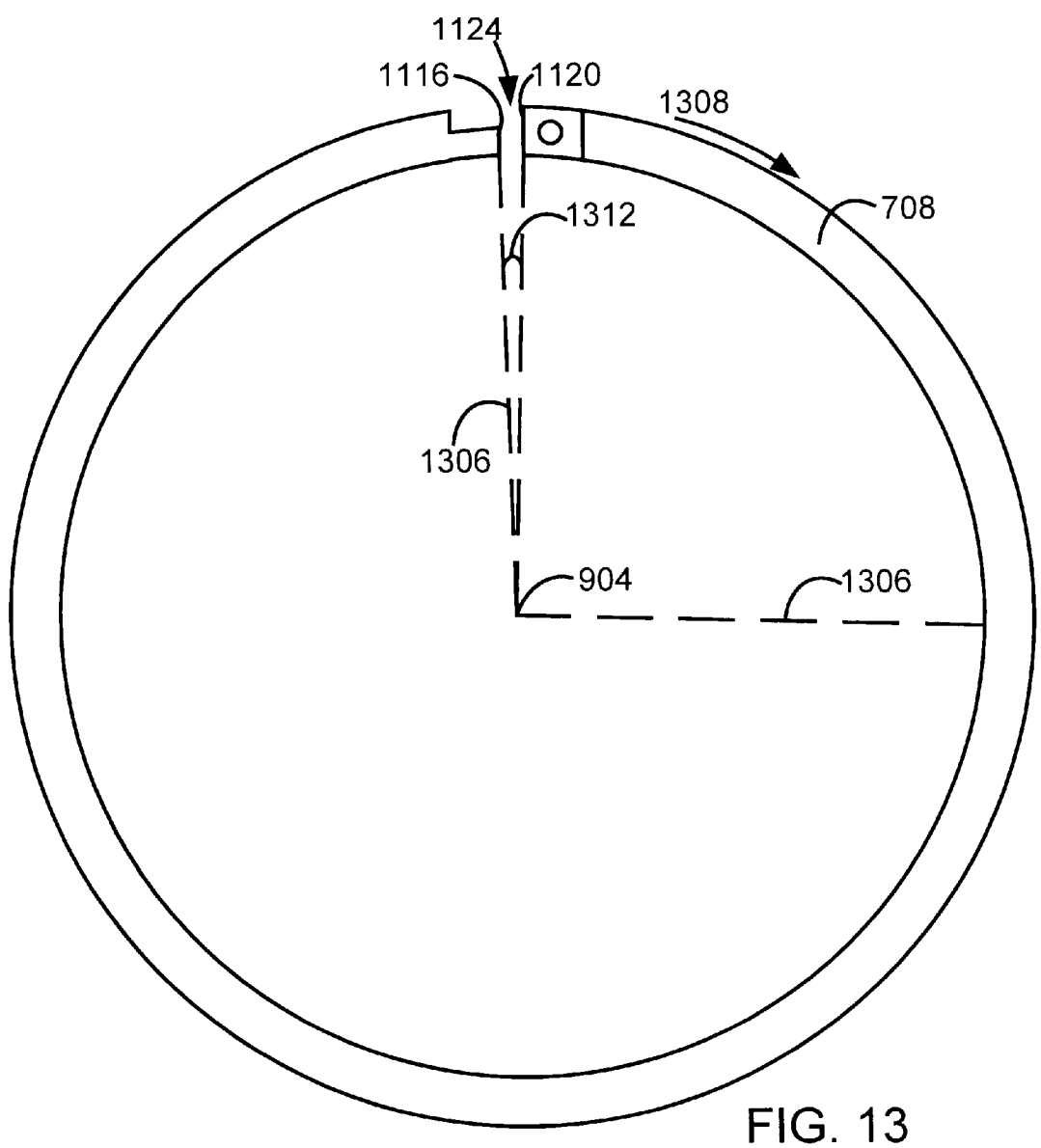
FIG. 13 is a top view of the second turn.

FIG. 13 is a top view of the second turn 708 alone. As shown in FIG. 11 and FIG. 13, the second turn 708 has a first end 1116 and a second end 1120, where the second turn 708 has a first end 1116 and a second end 1120, which are separated by a second turn gap 1124. The first turn 704 is separated from the second turn 708 by a first turn-second turn gap 1128. The length of the first turn-second turn gap 1128 is radial to the first and second turns 704, 708. The second turn 708 is centered on the antenna axis 904. The first turn 704 and second turn 708 are concentric, so that they are centered around the same point on the antenna axis 904. The radius 1306 of the second turn 708 extends from the antenna axis 904 to a point on the second turn 708, so that the radius of the first turn 704 is larger than the radius 1306 of the second turn 708 by about the length of the first turn-second turn gap 1128. The circumference 1308 of the second turn 708 is the direction along the second turn from the first end 1116 along the second turn 708 to the second end 1120 of the second turn across the gap 1124 back to the first end 1116 of the second turn 708. Preferably, the gap 1124 is only a small part of the second turn 708. The gap 1124 forms an angle 1312 with the antenna axis, as shown. Preferably, the angle 1312 formed by the gap 1124 is less than 7°. More preferably, the angle 1312 formed by the gap is less than 5°. More preferably, the angle formed by the gap is less than 3°. The length of the second turn gap 1124 is substantially parallel to the circumference of the second turn 708. In this example, the first end 1116 and second end 1120 have a cut out corner sections. The distance between at least part of the first end 1116 of the second turn and the antenna axis 904 is equal to the distance between at least part of the second end 1120 of the second turn and the antenna axis 904. More preferably, the radius of the first end 1116 is equal to the radius of the second end 1120, as shown in FIG. 13. Preferably, the second turn 708 is substantially circular. More preferably, the second turn 708 is circular, as shown.

A first turn-second turn connector 1132 provides an electrical connection between the second end 1108 of the first turn and the first end 1116 of the second turn. In the preferred embodiment the first turn-second turn connector 1132 comprises a spanning section 1136, a first turn connector leg 1140, and a second turn connector leg 1144. Preferably, the spanning section 1136 is substantially parallel to the circumference of the first turn 704 and the circumference of the second turn 708 adjacent to the spanning section 1136. The first turn connector leg 1140 is substantially radial to the first turn 704. The second turn connector leg 1144 is substantially radial to the second turn 708. The spanning section 1136 is approximately midway between the first turn 704 and the second turn 708, as shown. The first turn connector leg 1140 is adjacent to an end of the first turn gap 1112. The second turn connector leg 1144 is adjacent to an end of the second turn gap 1124. In the preferred embodiment, the first turn gap 1112 and the second turn gap 1124 are adjacent to each other, so that an end of the first turn gap 1112 is along a radius as indicated by broken line 1150, which coincides with the beginning of the second turn gap 1124. This allows the gaps to be adjacent without overlapping, as shown. Other variations may allow the gaps 1112, 1124 to overlap by a distance preferably between 0.0625 inches (1.5875 mm) and −0.0625 inches (−1.57875 mm), where the negative value means that there is no overlap, but instead the gaps are separated so that measured along the first turn the radius that ends the first turn gap and the radius that begins the second turn gap are separated by less than 0.0625 inches. More preferably, the overlap of the first and second gaps is between 0.005 inches (0.127 mm) and −0.005 inches (−0.127 mm). In terms of percentage, the overlap of the first and second turn gaps is between 50% and −50% of the length of the first turn gap, where the negative value means that there is no overlap, but instead the gaps are separated so that measured along the first turn the radius that ends the first gap and the radius that ends the second gap are separated by less than 50% of the first gap length. More preferably, the overlap of the first and second turn gaps is between 25% and −25% of the first turn gap length. Most preferably, the overlap of the first and second turn gaps is between 5% and −5%. The connector 1132 is in the same plane as the first turn 704 and the second turn 708 and preferably has the same height as the first turn 704 and the second turn 708.

Figure 14:
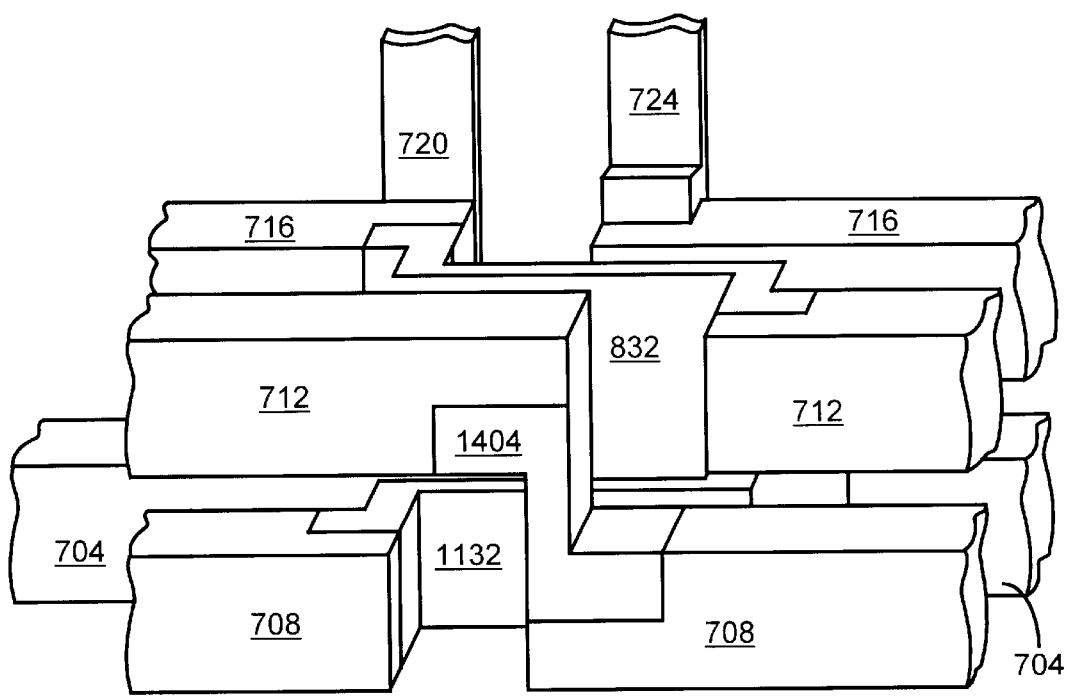
FIG. 14 is a schematic perspective view of parts of the first turn, the second turn, the third turn, and the fourth turn.

FIG. 14 is a schematic perspective view of section 728, showing parts of the first turn 704, the second turn 708, the third turn 712, the fourth turn 716, the input bus 720, the output bus 724, the first turn-second turn connector 1132, the third turn-fourth turn connector 832, and a second turn-third turn connector 1404.

In operation the antenna 700 may be used in plasma processing chamber 200. A current "I" flows from the 214 RF power source through the input bus 720 to the first end 1104 of the first turn 704. The current flows from the first end 1104 of the first turn 704 to the second end 1108 of the first turn 704. The first turn gap 1112 is provided to prevent a shorting between the first end of the first turn and the second end of the first turn. The current then travels from the second end of the first turn through the first turn connector leg 1140 in a direction substantially radial to the first turn and then along the spanning section 1136 in a direction substantially parallel to the circumferences of the first turn 704 and the second turn 708 adjacent to the spanning section 1136. The current then flows through the second turn connector leg 1144 in a direction substantially radial to the second turn to the first end 1116 of the second turn 708. The current flows from the first end 1116 of the second turn 708 to the second end 1120 of the second turn 708, and then through the second turn-third turn connector 1404 to the first end 804 of the third turn 712. The current flows from the first end 804 of the third turn to the second end 808 of the third turn 712. The third turn gap 812 is provided to prevent a shorting between the first end of the third turn 804 and the second end of the third turn 808. The current then travels from the second end of the third turn 808 through the third turn connector leg 840 in a direction substantially radial to the third turn and then along the spanning section 836 in a direction substantially parallel to the circumferences of the third turn 712 and the fourth turn 716 adjacent to the spanning section 836. The current then flows through the fourth turn connector leg 844 in a direction substantially radial to the fourth turn to the first end 816 of the fourth turn 716. The current then flows from the first end of the fourth turn 816 to the second end of the fourth turn 820 and through the output bus 724. The RF generator causes the current "I" to alternate directions.

The spanning section 1136 of the first turn-second turn connector 1132 provides a current path that is substantially parallel to the first turn adjacent to the first turn gap 1112 in the same plane as the first turn 704. In addition, the spanning section 1136 of the first turn-second turn connector 1132 provides a current path that is substantially parallel to the second turn 708 adjacent to the second turn gap 1124 and in the same plane as the second turn 708. By placing the first turn gap 1112 and the second turn gap 1124 so that they are adjacent to each other but do not overlap each other, the first turn 704, second turn 708, and spanning section 1136 provide two current paths in a complete loop without a gap or an overlap causing three current paths at a location.

During implementation a small gap or overlap may result, but minimizing the gap or overlap is desirable to provide an azimuthally uniform RF excitation to generate a uniform plasma. The spanning section 1136 is between the first and second turns 704, 708 so that the current path provided by the spanning section 1136 is close to the first turn 704 and second turn 708. Preferably, the spanning section 1136 is substantially midway between the first turn 704 and second turn 708 to provide a more azimuthally uniform RF excitation and yet maintain a gap between the first turn 704 and the second turn 708.

The spanning section 836 of the third turn-fourth turn connector 832 provides a current path that is substantially parallel to the third turn adjacent to the third turn gap 812 in the same plane as the third turn 712. In addition, the spanning section 836 of the third turn-fourth turn connector 832 provides a current path that is substantially parallel to the fourth turn 716 adjacent to the fourth turn gap 824 and in the same plane as the fourth turn 716. By placing the third turn gap 812 and the fourth turn gap 824 so that they are adjacent to each other but do not overlap each other, the third turn 712, fourth turn 716, and spanning section 836 provide two current paths in a complete loop without a gap or an overlap causing three current paths at a location. During implementation a small gap or overlap may result, but minimizing the gap or overlap is desirable to provide an azimuthally uniform RF excitation to generate a uniform plasma. The spanning section 836 is between the third and fourth turns 712, 716 so that the current path provided by the spanning section 836 is close to the third turn 712 and fourth turn 716. Preferably, the spanning section 836 is substantially midway between the third turn 712 and fourth turn 716 to provide a more azimuthally uniform RF excitation and yet maintain a gap between the third turn 712 and the fourth turn 716.

By placing the first turn connector leg 1140 along a radius of the first turn 704 and in the plane of the first turn 704 the disruption from RF excitation caused current passing through the first turn connector leg 1140 is minimized. This is partly accomplished by having the first turn connector leg 1140 in the same plane as the first turn 704 so that the length of the first turn connector leg may be minimized. In addition, having the first turn connector leg 1140 being radial to the first turn 704 may also minimize RF disruptions from the first turn connector leg 1140. For these reasons the second turn connector leg 1144 is substantially radial to the second turn 708 and substantially perpendicular to the spanning section 1136, the third turn connector leg 840 is substantially radial to the third turn 712 and substantially perpendicular to the spanning section 836, and the fourth turn connector leg 844 is substantially radial to the fourth turn 716 and substantially perpendicular to the spanning section 836.

Each turn with a gap makes a single loop with a gap separating ends of the loop. This configuration is different than other antennas which use a spiral where individual loops with small gaps are not used and where then ends of each loop are at different radii.

Figure 15:
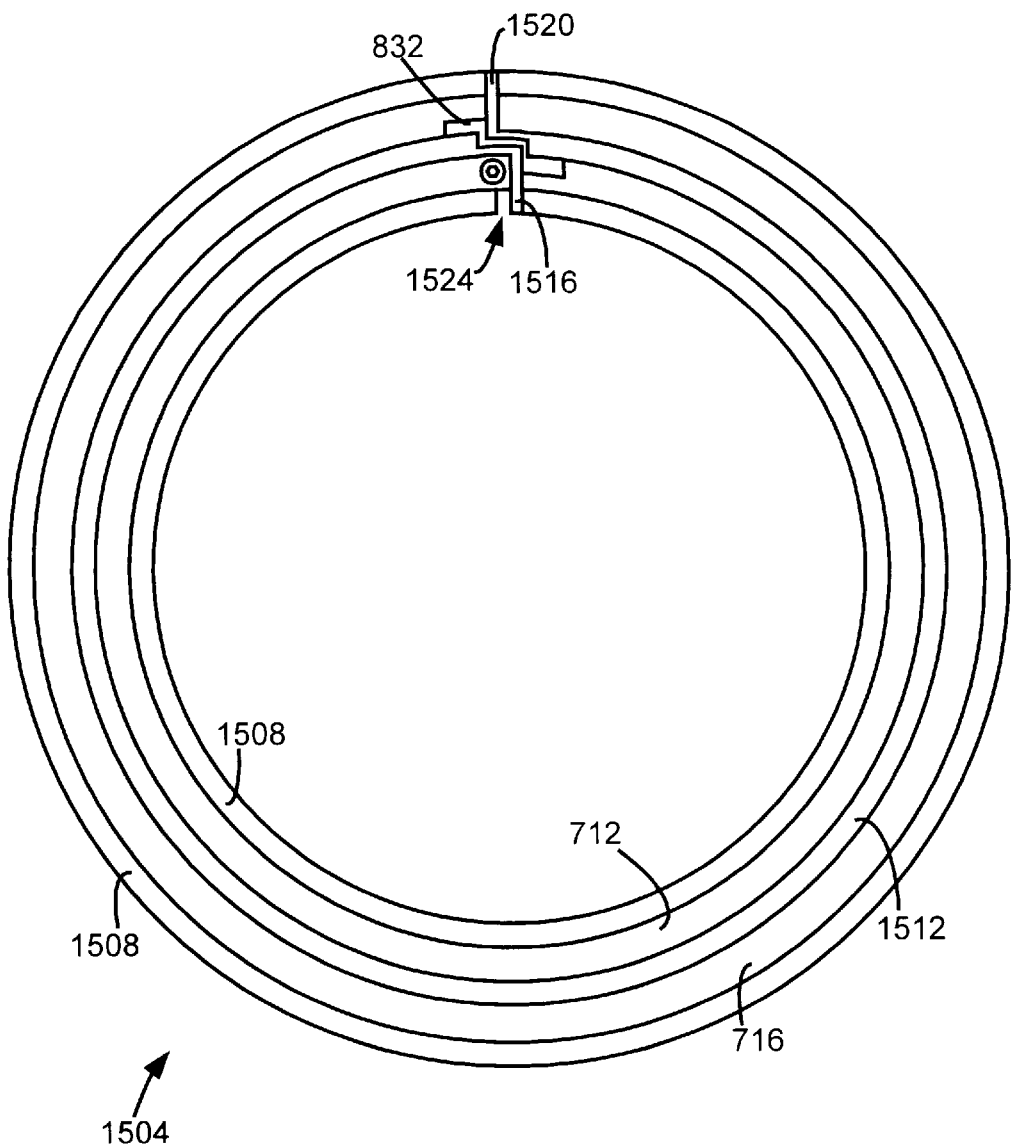
FIG. 15 is a top view of the third turn, the fourth turn, and a third turn-fourth turn connector mounted on a central insulator.

In the preferred embodiment, an insulator is provided to prevent arcing. FIG. 15 is a top view of the third turn 712, the fourth turn 716, and the third turn-fourth turn connector 832 mounted on a central insulator 1504 that may be used in a preferred embodiment of the invention. The central insulator 1504 comprises a base ring 1508 and a top ridge ring 1512. A third turn gap insulator 1516 and a fourth turn gap insulator 1520 also form top ridges, which are connected to the top ridge ring 1512. A gap 1524 in the base ring 1508 provides a passage for the second turn-third turn connector.

Figure 16:
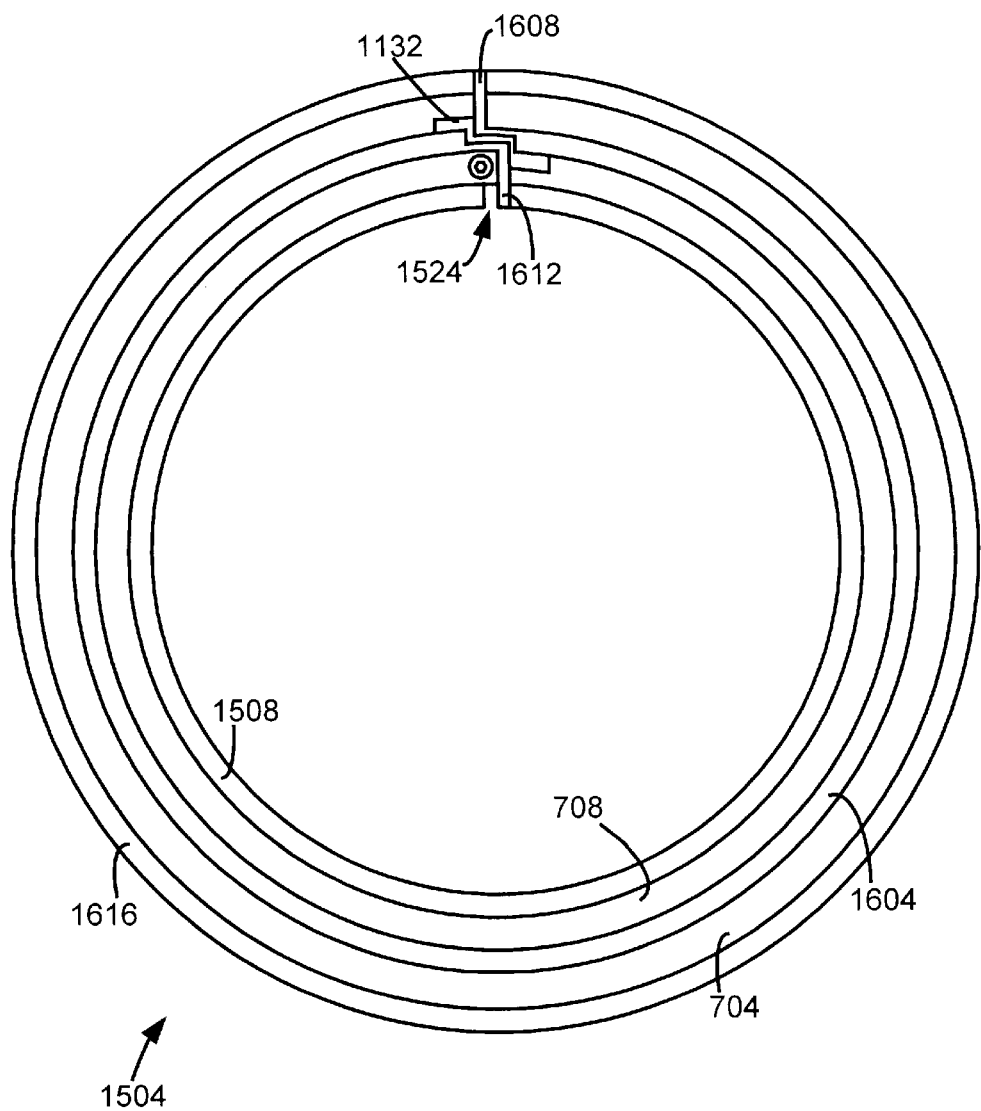
FIG. 16 is a bottom view of the first turn, the second turn, and a first turn-second turn connector mounted on the central insulator.

FIG. 16 is a bottom view of the first turn 704, the second turn 708, and the first turn-second turn connector 1132 mounted on the central insulator 1504. The central insulator 1504 further comprises a bottom ridge ring 1604. A first turn gap insulator 1608 and a second turn gap insulator 1612 also form bottom ridges, which are connected to the bottom ridge ring 1604. An outer ridge 1616 is placed around the first turn 704. The gap 1524 that provides a passage for the second turn-third turn connector is shown in the base ring 1508.

Figure 17:
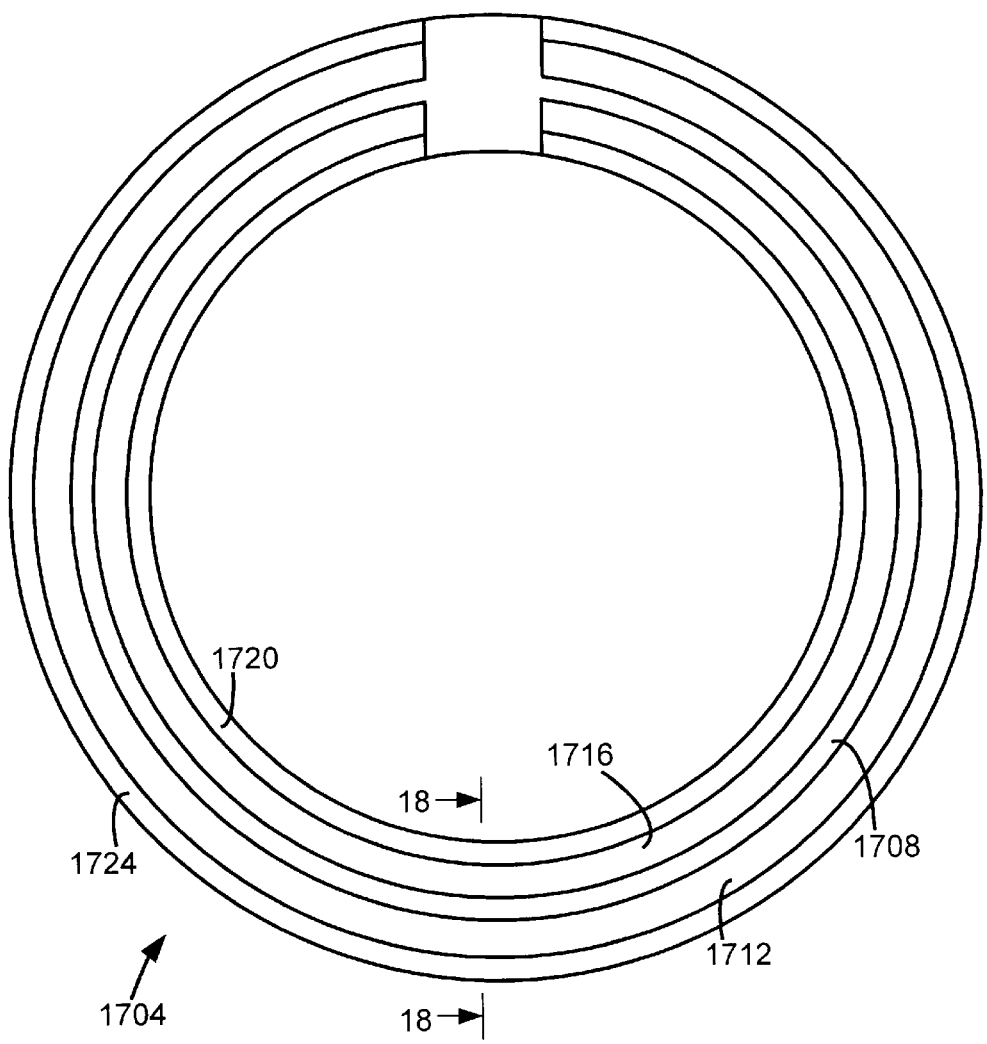
FIG. 17 is a top view of a bottom insulator.

FIG. 17 is a top view of a bottom insulator 1704. The bottom insulator 1704 is in the shape of a ring, with a central groove 1708, a first turn groove 1712, a second turn groove 1716, an inner ridge 1720 and an outer ridge 1724.

Figure 18:
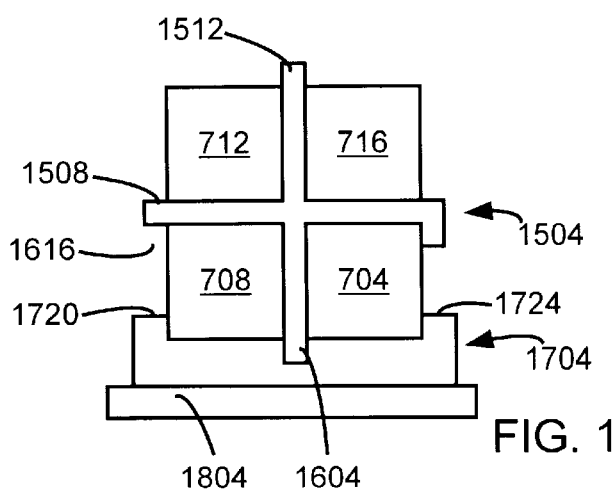
FIG. 18 is a cross-sectional view of the bottom insulator, the first turn, the second turn, the third turn, the fourth turn, and the central insulator.

FIG. 18 is a cross-sectional view of the bottom insulator 1704 of FIG. 17 along cut lines 18—18, with the first turn 704, the second turn 708, the third turn 712, the fourth turn 716 and the central insulator 1504 mounted therein. The bottom ridge ring 1604 of the central insulator 1504 is mounted into the central groove of the bottom insulator 1704. The first turn 704 is mounted in the first turn groove 1712. The second turn 708 is mounted in the second turn groove 1716. The top ridge ring 1512 of the central insulator 1504 fills the gap between the third turn 712 and fourth turn 716, with the gap being a sufficient length to prevent arching. The top ridge ring 1512 extends above the third turn 712 and fourth turn 716 so that distance along the surface of the top ridge ring 1512 from the third turn 712 to the fourth turn 716 is greater than the minimum surface distance required to prevent arcing. The bottom insulator 1704 may be placed on a faraday shield 1804.

Figure 22:
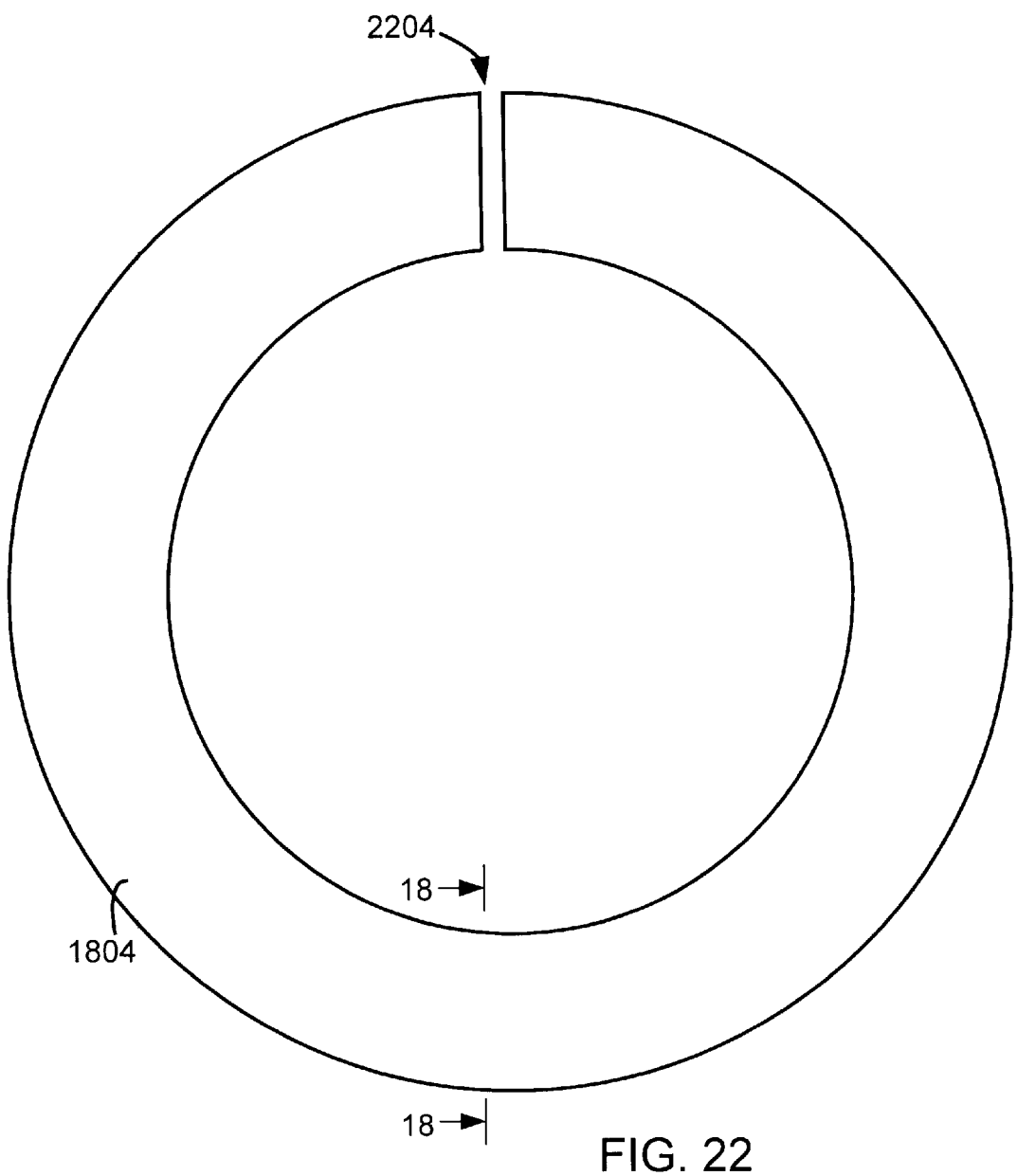
FIG. 22 is a top view of a faraday shield.

FIG. 22 is a top view of the faraday shield 1804. The faraday shield 1804 may be provided to further minimize azimuthal variations in coupling and to control the extent of capacitive coupling. This may be implemented by either grounding the faraday shield 1804, applying a specified voltage to the faraday shield or allowing the faraday shield to float. Since the antenna footprint is in the shape of a ring, the faraday shield 1804 may be in a ring shape that matches the footprint of the antenna. In the preferred embodiment, the faraday shield 1804 is a ring shape conductive material that is slightly larger than the footprint of the antenna and with at least one radial slot 2204 across part of the ring. FIG. 18 shows that the width of the faraday shield 1804 is slightly larger than the width of the antenna. In other preferred embodiments more than one slot is provided.

Figure 19:
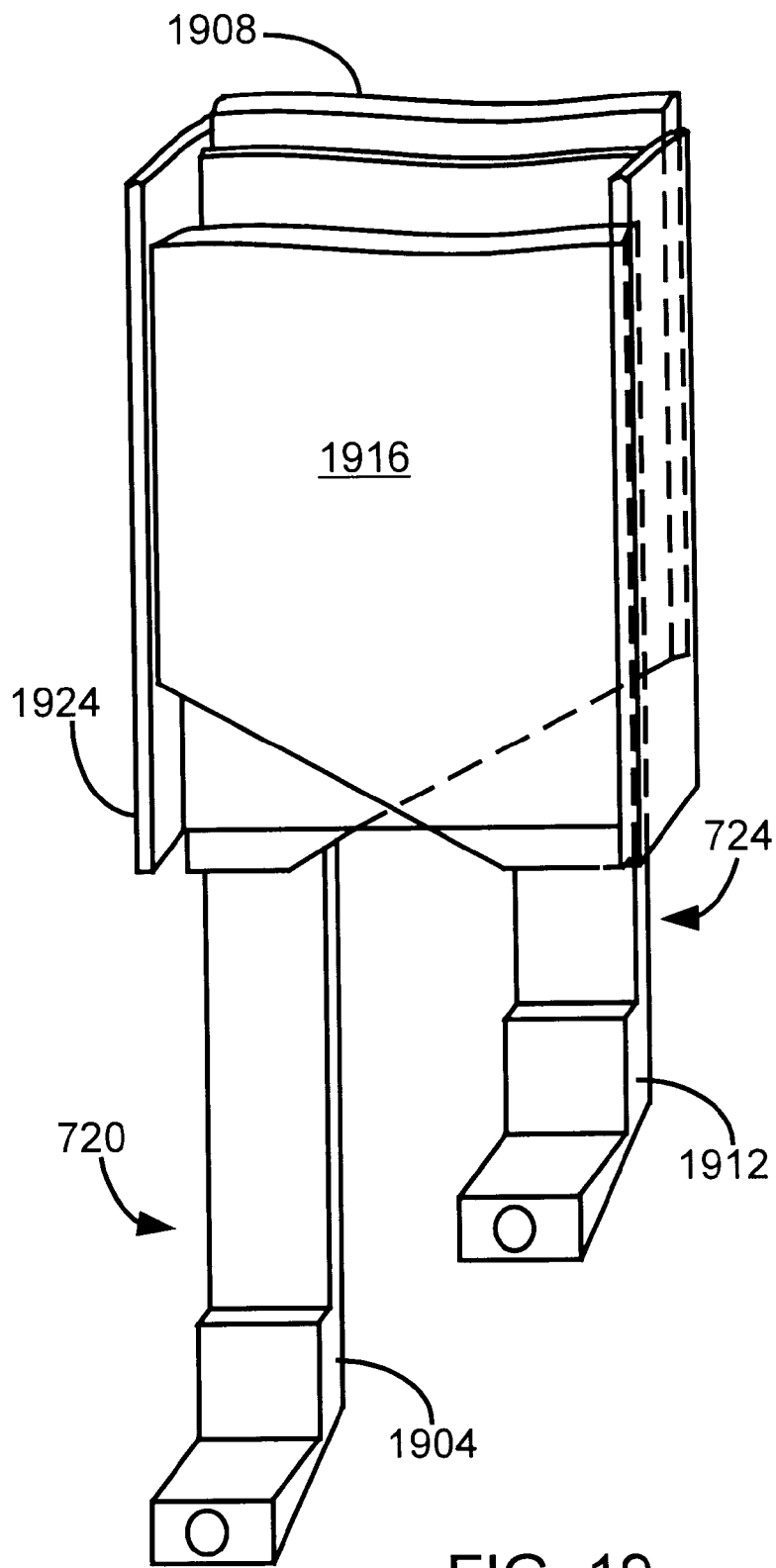
FIG. 19 is a cut away perspective view of the input bus and the output bus.

FIG. 19 is a cut away perspective view of the input bus 720 and the output bus 724. In this embodiment, the input bus 720 comprises an input connector 1904 connected to a tapered input conducting bar 1908. The output bus 724 comprises an output connector 1912 connected to a tapered output conducting bar 1916. The tapered input conducting bar 1908 and tapered output conducting bar 1916 are aligned and placed close together as shown. A dielectric piece 1924 in an I shape is placed between the tapered input conducting bar 1908 and tapered output conducting bar 1916 to prevent arcing between the tapered input conducting bar 1908 and the tapered output conducting bar 1916. The alignment and close placement of the tapered input conducting bar 1908 and the tapered output conducting bar 1916 helps to minimize RF asymmetries that may be caused by the tapered input conducting bar 1908 and the tapered output conducting bar 1916.

In an embodiment of the invention with a voltage of about 600 volts the third turn gap 812 and the fourth turn gap 824 are about 0.125 inches (3.175 mm). The path length along the surface of the insulator 1504 between the first end 804 and the second end 808 of the third turn 712 is about 0.25 inches (6.35 mm). The path length along the surface of the insulator 1504 is increased by extending the insulator beyond the ends of the turns as shown in FIG. 18.

Figure 20:
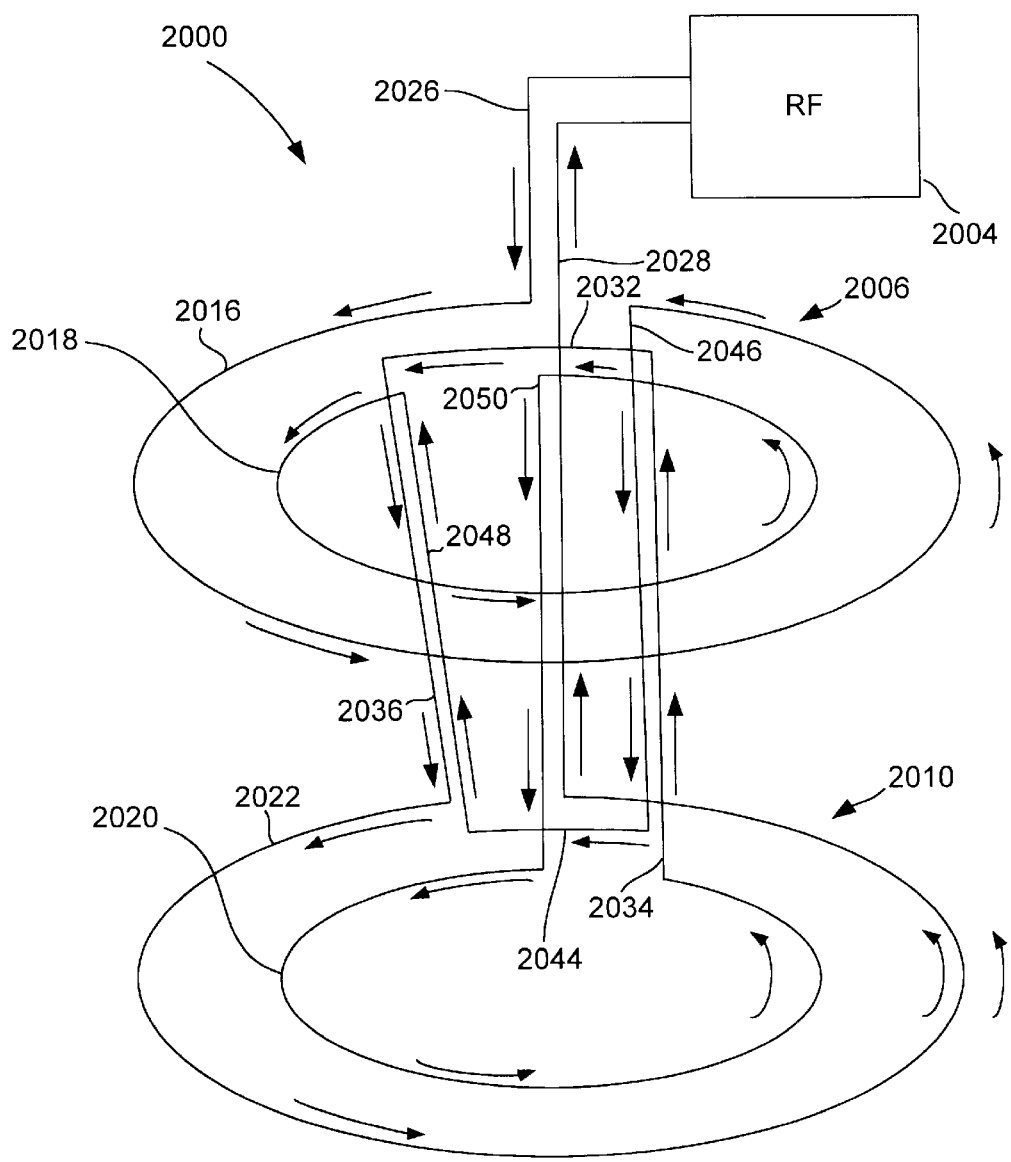
FIG. 20 is a schematic view of another embodiment of the invention.

FIG. 20 is a schematic illustration of another embodiment of an antenna arrangement 2000 connected to an RF power source 2004. In this embodiment, the antenna arrangement comprises a first loop 2006 and a second loop 2010. The first loop 2006 comprises a first turn 2016 and a second turn 2018. The second loop 2010 comprises a third turn 2020 and a fourth turn 2022. An input feed 2026 is provided from RF power source 2004 to a first end of the first turn 2016. An output feed 2028 is connected from the fourth turn 2022 to the RF power source 2004. A first spanning section 2032 is connected between the third turn 2020 and the fourth turn 2022 and is coplanar to the first turn 2016 and the second turn 2018 and spans the gap in the first turn 2016 and the gap in the second turn 2018. A third turn leg connector 2034 connects a first end of the first spanning section 2032 to the third turn 2020. A fourth turn leg connector 2036 connects a second end of the first spanning section 2032 to the fourth turn 2022. A second spanning section 2044 is connected between the first turn 2016 and the second turn 2018 and is coplanar to the third turn 2020 and the fourth turn 2022 and spans the gap in the third turn 2020 and the gap in the fourth turn 2022. A first turn leg connector 2046 connects a first end of the second spanning section 2044 to the first turn 2016. A second turn leg connector 2048 connects a second end of the second spanning section 2044 to the second turn 2018. A second turn-third turn connector 2050 connects the second turn 2018 to the third turn 2020. As discussed in the previous embodiments, the gaps are minimized. Also as discussed above, preferably the gaps in each turn makes a radial angle of less than 7°. More preferably, the gaps in each turn make a radial angle of less than 5°. Most preferably, the gaps in each turn makes a radial angle of less than 3°. In addition the gap in the first turn and the gap in the second turn overlap by between 50% to −50% the length of the gap in the first turn and the gap in the third turn and the gap in the fourth turn overlap by between 50% to −50% the length of the gap in the third turn. More preferably, the gap in the first turn and the gap in the second turn overlap by between 25% to −25% the length of the gap in the first turn and the gap in the third turn and the gap in the fourth turn overlap by between 25% to −25% the length of the gap in the third turn. More preferably, the gap in the first turn and the gap in the second turn overlap by between 5% to −5% the length of the gap in the first turn and the gap in the third turn and the gap in the fourth turn overlap by between 5% to −5% the length of the gap in the third turn. In addition, the first spanning section spans the gap in the first turn and the gap in the second turn. The second spanning section spans the gap in the third turn and the gap in the fourth turn. The first and second spanning sections provide a current path to compensate for the gaps. The spanning sections are coplanar and kept close to the gaps.

In operation, the current path is from the RF power source 2004 through the input feed 2026 to a first end of the first turn 2016. The current goes around the first turn 2016 to a second end of the first turn connected to the first turn leg connector 2046. The current passes from the first turn leg connector 2046 through the second spanning section 2044 to the second turn leg connector 2048. The current passes from the second leg connector 2048 through the first end of the second turn 2018 to the second end of the second turn 2018 and then to the second turn-third turn connector 2050. From the second turn-third turn connector 2050 the current passes through a first end of the third turn 2020 around the third turn 2020 to a second end of the third turn 2020. The current path passes from the second end of the third turn 2020 through a third turn leg connector 2034 to a first end of the first spanning section 2032 and then to a fourth turn leg connector 2036. The current path passes from the fourth turn leg connector 2036 through a first end of the fourth turn 2022 to a second end of the fourth turn 2022. From the second end of the fourth turn 2022 the current passes to a output feed 2028 to the RF source 2004. The RF source 2004 causes the current "I" to alternate directions.

The first spanning section 2032 provides a current path to compensate for the gap in the first turn 2016 and the gap in the second turn 2018. The current path provided by the first spanning section 2032 is coplanar and close to the gap in the first turn 2016 and the gap in the second turn 2018. In addition, the current path, provided by the first spanning section 2032, is substantially parallel to the circumference of the first turn 2016 and the second turn 2018. Likewise, the second spanning section 2044 provides a current path to compensate for the gap in the third turn 2020 and the gap in the fourth turn 2022. The current path provided by the second spanning section 2044 is coplanar and close to the gap in the third turn 2020 and the gap in the fourth turn 2022. In addition, the current path, provided by the second spanning section 2044, is substantially parallel to the circumference of the third turn 2020 and the fourth turn 2022. The connector legs 2026, 2028, 2046, 2048, 2050, 2034, and 2036 carry non-azimuthal currents which can cause azimuthal asymmetry. This asymmetry can be minimized by locating connector legs with opposing currents as close together as possible. Following that concept, the third turn leg connector 2034 is placed near the first turn leg connector 2046, so that the current in the third turn leg connector 2034 is always opposite the current direction in the first turn leg connector 2046. Likewise, the second turn leg connector 2048 is partially cancelled by the fourth turn leg connector 2036. The feed 2028 is partially cancelled by the input feed 2026 and the second turn-third turn connector 2050.

This embodiment is created with a design preference to place connector legs with opposing currents close together so they at least partially cancel each other which minimizes the area enclosed by the resulting magnetic dipoles to provide improved azimuthal symmetry.

Although this embodiment is schematically illustrated, preferably each turn is formed as a ring as shown in the previous embodiment. The rings may be circular or square, but the ends of the rings adjacent to the gaps should have the same radii, as discussed in the previous embodiment. A dielectric material, as discussed in the previous embodiment, may be placed within the gaps and between the turns and loops to allow a reduction in gap size.

Figure 21:
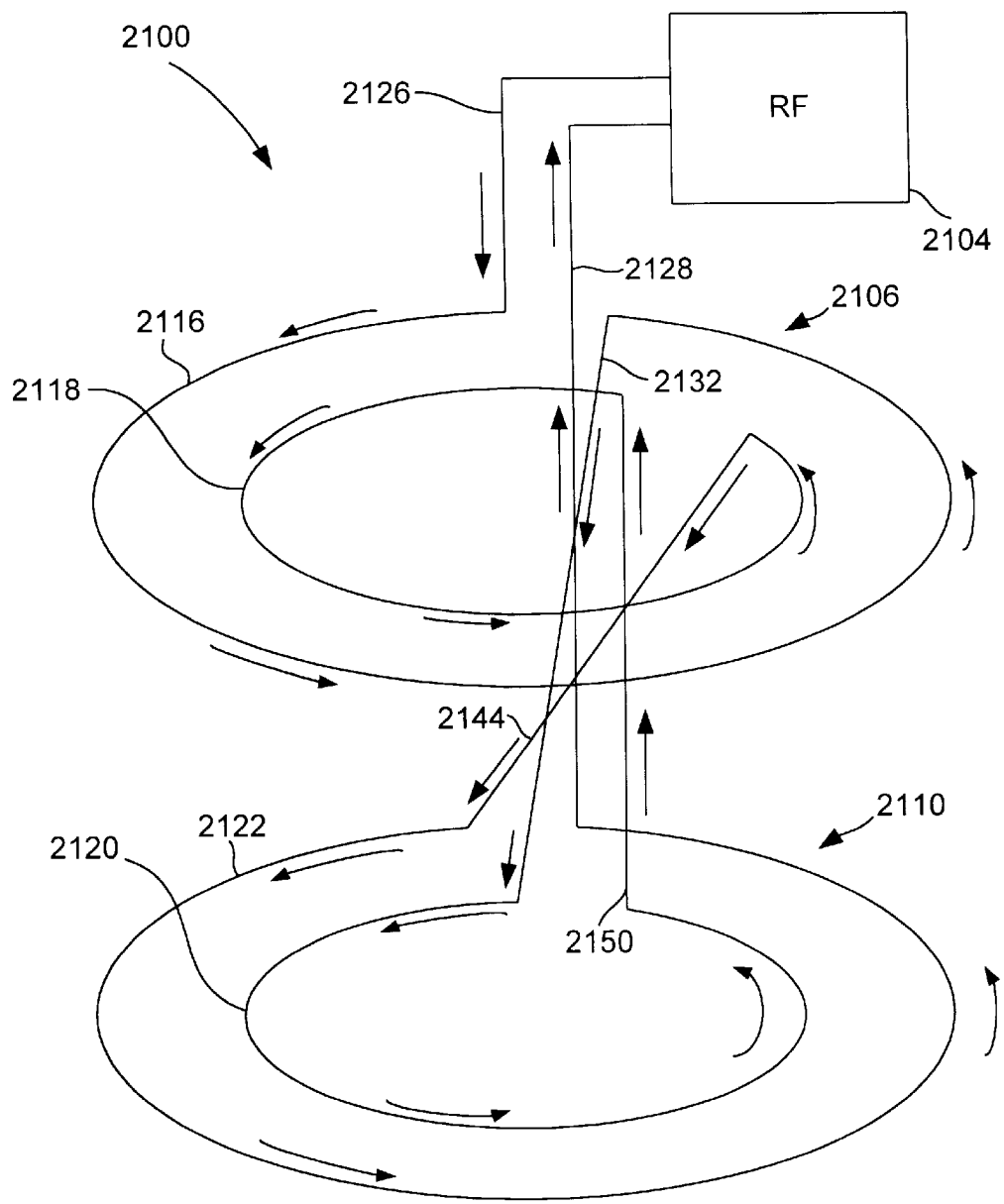
FIG. 21 is a schematic view of another embodiment of the invention.

FIG. 21 is a schematic illustration of another embodiment of an antenna arrangement 2100 connected to an RF power source 2104. In this embodiment, the antenna arrangement comprises a first loop 2106 and a second loop 2110. The first loop 2106 comprises a first turn 2116 and a third turn 2118, which is inside the first turn 2116. The second loop 2110 comprises a second turn 2120 and a fourth turn 2122, which is outside of the second turn 2120. An input feed 2126 is provided from RF power source 2104 to a first end of the first turn 2116. An output feed 2128 is connected from the fourth turn 2122 to the RF power source 2104. A first spanning section 2132 is connected between the first turn 2116 and the second turn 2120, so that it extends from an upper outer turn to a lower inner turn. A second spanning section 2144 is connected between the third turn 2118 and the fourth turn 2122, so that it extends from an upper inner turn to a lower outer turn. A second turn-third turn connector 2150 connects the second turn 2120 to the third turn 2118. As discussed in the previous embodiments, the gaps are minimized. Also as discussed above, preferably the gaps in each turn makes a radial angle of less than 7°. More preferably, the gaps in each turn make a radial angle of less than 5°. Most preferably, the gaps in each turn makes a radial angle of less than 3°. In addition, the gap in the first turn and the gap in the second turn overlap by between 50% to −50% the length of the gap in the first turn, and the gap in the third turn and the gap in the fourth turn overlap by between 50% to −50% the length of the gap in the third turn. More preferably, the gap in the first turn and the gap in the second turn overlap by between 25% to −25% the length of the gap in the first turn and the gap in the third turn and the gap in the fourth turn overlap by between 25% to −25% the length of the gap in the third turn. More preferably, the gap in the first turn and the gap in the second turn overlap by between 5% to −5% the length of the gap in the first turn, and the gap in the third turn and the gap in the fourth turn overlap by between 5% to −5% the length of the gap in the third turn. Although the first turn is not in the same loop as the second turn, the second turn is adjacent to the first turn, so that the gaps in adjacent turns overlap within the above described limits. Although the third turn is not in the same loop as the fourth turn, the third turn is adjacent to the fourth turn, so that the gaps in adjacent turns overlap by the above described limits. In addition, the first spanning section 2132 spans the gap in the first turn 2116 and the gap in the second turn 2120. The second spanning section 2144 spans the gap in the third turn 2118 and the gap in the fourth turn 2122. The first and second spanning sections provide a current path to compensate for the gaps.

In operation, the current path is from the RF power source 2104 through the input feed 2126 to a first end of the first turn 2116. The current goes around the first turn 2116 to a second end of the first turn connected to the first spanning section 2132. The current passes from the first spanning section 2132 through the first end of the second turn 2120 to the second end of the second turn and then to the second turn-third turn connector 2150. From the second turn-third turn connector 2150 the current passes through a first end of the third turn around the third turn 2118 to a second end of the third turn. The current path passes from the second end of the third turn through the second spanning section 2144 and through a first end of the fourth turn 2122 to a second end of the fourth turn. From the second end of the fourth turn 2122 the current passes to a output feed 2128 to the RF source 2104. The RF source 2104 causes the current "I" to alternate directions.

The first spanning section 2132 provides a current path to compensate for the gap in the first turn 2116 and the gap in the second turn 2120. The current path provided by the first spanning section 2132 is not coplanar to the first turn 2116 or the second turn 2120. The current path provided by the first spanning section 2132 has a component that is substantially parallel to the circumference of the first turn 2116 and the second turn 2120 but also has a vertical and radial component. Likewise, the second spanning section 2144 provides a current path to compensate for the gap in the third turn 2118 and the gap in the fourth turn 2122. The current path provided by the second spanning section 2144 is not coplanar to the third turn 2118 or the fourth turn 2122. The current path provided by the second spanning section 2144 has a component that is substantially parallel to the circumference of the third turn 2118 and the fourth turn 2122 but also has a vertical and radial component. The first spanning section 2132 and the second spanning section 2144 are placed close to and between the second turn-third turn connector 2150 and the output feed 2128 so that the vertical components from the first spanning section 2132 and the second spanning section 2144 are partially cancelled by the current from the second turn-third turn connector 2150 and the output feed 2128 and so that the radial component from the first spanning section 2132 is partially cancelled by the radial component from the second spanning section 2144. In this way, this embodiment is also created with a design preference to place connector legs with opposing currents close together so they at least partially cancel each other which minimizes the area enclosed by these magnetic dipoles to provide improved azimuthal symmetry.

Although this embodiment is schematically illustrated, preferably each turn is formed as a ring as shown in the previous embodiment. The rings may be circular or square, but the ends of the rings adjacent to the gaps should have the same radii, as discussed in the previous embodiment. A dielectric material, as discussed in the previous embodiment, may be placed within the gaps and between the turns and loops to allow a reduction in gap size.

Although in previous embodiments, the antenna is formed from a first loop and a second loop, where the first loop and second loops are of the same geometry and are co-axial and where one loop is placed over the other loop, other types of antenna arrangements may be used. Such arrangements may use a single loop or may provide that the second loop is of a different geometric shape than the first loop. The loops may have more than two turns. Preferably, the gaps in the loops are minimized so that the gaps make a radial angle of less than 3° and so that radii of the ends of the turns adjacent to a gap are the same. In addition, preferably, gaps in two adjacent turns overlap by between 5% and −5%. In addition, a current path is provided to span the gaps. Preferably, dipole components are used to partially cancel each other. In addition, the input and output feeds may be coaxial for part of their lengths as another way of reducing their dipole effect.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An antenna arrangement for generating an electric field inside a process chamber, said antenna arrangement comprising:

a first loop disposed around an antenna axis, comprising:

a first turn with a first turn gap wherein a first end of the first turn is on a first side of the first turn gap and a second end of the first turn is on a second side of the first turn gap;

a second turn with a second turn gap wherein a first end of the second turn is on a first side of the second turn gap and a second end of the second turn is on a second side of the second turn gap, wherein the second turn is concentric and coplanar with the first turn and spaced apart from the first turn, and where the antenna axis passes through the center of the first turn and second turn; and a first current path connector electrically connected to the first turn and the second turn comprising a spanning section between and coplanar with the first turn and the second turn and which spans the first turn gap and the second turn gap.

2. The antenna arrangement as recited in claim 1, wherein part of the first end of the first turn is a distance from the antenna axis that is equal to the distance between part of the second end of the first turn and the antenna axis, and wherein part of the first end of the second turn is a distance from the antenna axis that is equal to the distance between part of the second end of the second turn and the antenna axis.

3. The antenna arrangement as recited in claim 1, wherein the first turn gap makes a radial angle of less than 10° of the first turn and wherein the second turn gap makes a radial angle of less than 10° of the second turn.

4. The antenna arrangement as recited in claim 3, wherein the first turn gap has a length and overlaps with the second turn gap by a distance between 50% and −50% of the length of the first turn gap.

5. The antenna arrangement as recited in claim 4, wherein the first current path connector is connected between the first turn and the second turn and comprises:
 a spanning section with a first end and a second end, wherein the spanning section is substantially parallel to a circumference of the first turn;
 a first turn connector leg connected between the first end of the spanning section and the second end of the first turn, wherein the first turn connector leg is substantially radial to the first turn; and
 a second turn connector leg connected between the second end of the spanning section and the first end of the second turn, wherein the second turn connector leg is substantially radial to the second turn.

6. The antenna arrangement as recited in claim 5, wherein the first turn is substantially circular and the second turn is substantially circular.

7. The antenna arrangement as recited in claim 6, further comprising a dielectric medium is disposed between the first turn and second turn to eliminate arcing therebetween.

8. The antenna arrangement as recited in claim 1, further comprising
 a second loop coupled to the first loop, wherein the second loop, said second loop having a geometry that is substantially similar to a geometry of the first loop, the second loop being vertically displaced from the first loop and place around the antenna axis so that the first loop and second loop are symmetrically aligned relative to the antenna axis and wherein the first loop and second loop are arranged to carry a current there through in the same direction around the antenna axis, wherein the second loop comprises:
 a third turn with a third turn gap; and
 a fourth turn with a fourth turn gap.

9. The antenna arrangement as recited in claim 8, further comprising an RF power source coupled to the first loop and the second loop.

10. The antenna arrangement as recited in claim 9 wherein the first and second loops have a combined length that is smaller than the wavelength of energy transmitted through the antenna arrangement.

11. The antenna arrangement as recited in claim 10 wherein said second loop effectively shields a terminal voltage of said first loop.

12. The antenna arrangement as recited in claim 9, wherein said first and second loops cooperate to form an azimuthally symmetric electric field inside a process chamber with a first RF energy generated by a first RF power source, wherein said azimuthally symmetric electric field forms a substantially azimuthally symmetric plasma, which produces a substantially uniform process rate across the surface of a substrate disposed inside of said process chamber.

13. The antenna arrangement as recited in claim 9, further comprising a dielectric medium is disposed between the first turn, the second turn, the third turn, and fourth turn to eliminate arcing there between.

14. The antenna arrangement as recited in claim 1, wherein the first end of the first turn is a distance from the antenna axis that is equal to the distance between the second end of the first turn and the antenna axis, and wherein part of the first end of the second turn is a distance from the antenna axis that is equal to the distance between part of the second end of-the second turn and the antenna axis.

15. A plasma processing apparatus for processing a substrate, comprising:
 a process chamber in which a plasma is both ignited and sustained for said processing;
 a multi-layered antenna configured to produce an electric field via RF energy inside said process chamber, said antenna having a first loop and a second loop, which are substantially similar to one another, and which are symmetrically aligned relative to an antenna axis, the first loop comprising:
 a first turn with a first turn gap wherein a first end of the first turn is on a first side of the first turn gap and a second end of the first turn is on a second side of the first turn gap;
 a second turn with a second turn gap wherein a first end of the second turn is on a first side of the second turn gap and a second end of the second turn is on a second side of the second turn gap, wherein the second turn is concentric and coplanar with the first turn and spaced apart from the first turn, and where the antenna axis passes through the center of the first turn and second turn; and
 a first turn-second turn connector electrically connected between the second end of the first turn and the first end of the second turn comprising a spanning section between and coplanar with the first turn and the second turn and which spans the first turn gap and the second turn gap; and
 a multi-layered window configured to allow the passage of said RF energy from said antenna to said process chamber, said window having a first layer and a second layer, said second layer being arranged to suppress capacitive coupling, which may occur between said plasma and said antenna.

16. An antenna arrangement for generating an electric field inside a process chamber, said antenna arrangement comprising:
 a first turn with a first turn gap wherein a first end of the first turn is on a first side of the first turn gap and a second end of the first turn is on a second side of the first turn gap, and wherein the first turn gap forms a radial angle of less than 5°;
 a second turn with a second turn gap wherein a first end of the second turn is on a first side of the second turn gap and a second end of the second turn is on a second side of the second turn gap, wherein the second turn is coaxial with the first turn and spaced apart from the first turn, and wherein the antenna axis passes through the center of the first turn and second turn, wherein the second turn gap forms a radial angle of less than 5° and wherein the first turn gap has a length and overlaps with the second turn gap by between 50% and −50% of the first turn gap; and a first current path connector electrically connected to the first turn and the second turn comprising a spanning section which spans the first turn gap and the second turn gap.

* * * * *